(12) United States Patent
Matsumoto et al.

(10) Patent No.: US 8,089,612 B2
(45) Date of Patent: Jan. 3, 2012

(54) POSITION DETECTION APPARATUS, POSITION DETECTION METHOD, EXPOSURE APPARATUS, AND DEVICE FABRICATION METHOD

(75) Inventors: Takahiro Matsumoto, Utsunomiya (JP); Koichi Sentoku, Kawachi-gun (JP); Satoru Oishi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 385 days.

(21) Appl. No.: 12/412,295

(22) Filed: Mar. 26, 2009

(65) Prior Publication Data
US 2009/0244513 A1 Oct. 1, 2009

(30) Foreign Application Priority Data
Mar. 27, 2008 (JP) .................................. 2008-084098

(51) Int. Cl.
G03B 27/42 (2006.01)
G03B 27/54 (2006.01)
(52) U.S. Cl. .......................................... 355/53; 355/67
(58) Field of Classification Search .................... 355/52, 355/53, 55, 67; 250/548; 356/399–401
See application file for complete search history.

(56) References Cited

U.S. PATENT DOCUMENTS
6,335,537 B1 * 1/2002 Takahashi ...................... 250/548
6,483,571 B1 * 11/2002 Shiraishi .......................... 355/53
7,253,885 B2 * 8/2007 Matsumoto ...................... 355/77

FOREIGN PATENT DOCUMENTS
JP 2004-281904 A 10/2004
* cited by examiner

Primary Examiner — Hung Henry Nguyen

(57) ABSTRACT

The present invention provides a position detection apparatus including a first obtaining unit configured to obtain imaging characteristics of an imaging optical system for a plurality of light beams, having different wavelength with each other, of the light having the wavelength width, a second obtaining unit configured to obtain optical images of a target object for the plurality of light beams, a restoration unit configured to restore optical images of the target object for the plurality of light beams by correcting, deterioration in the obtained optical images of the target object attributed to the imaging optical system, based on the obtained imaging characteristics of the imaging optical system, and a generation unit configured to generate an optical image of the target object for light including the plurality of light beams by synthesizing the restored optical images of the target object for the plurality of light beams.

10 Claims, 17 Drawing Sheets

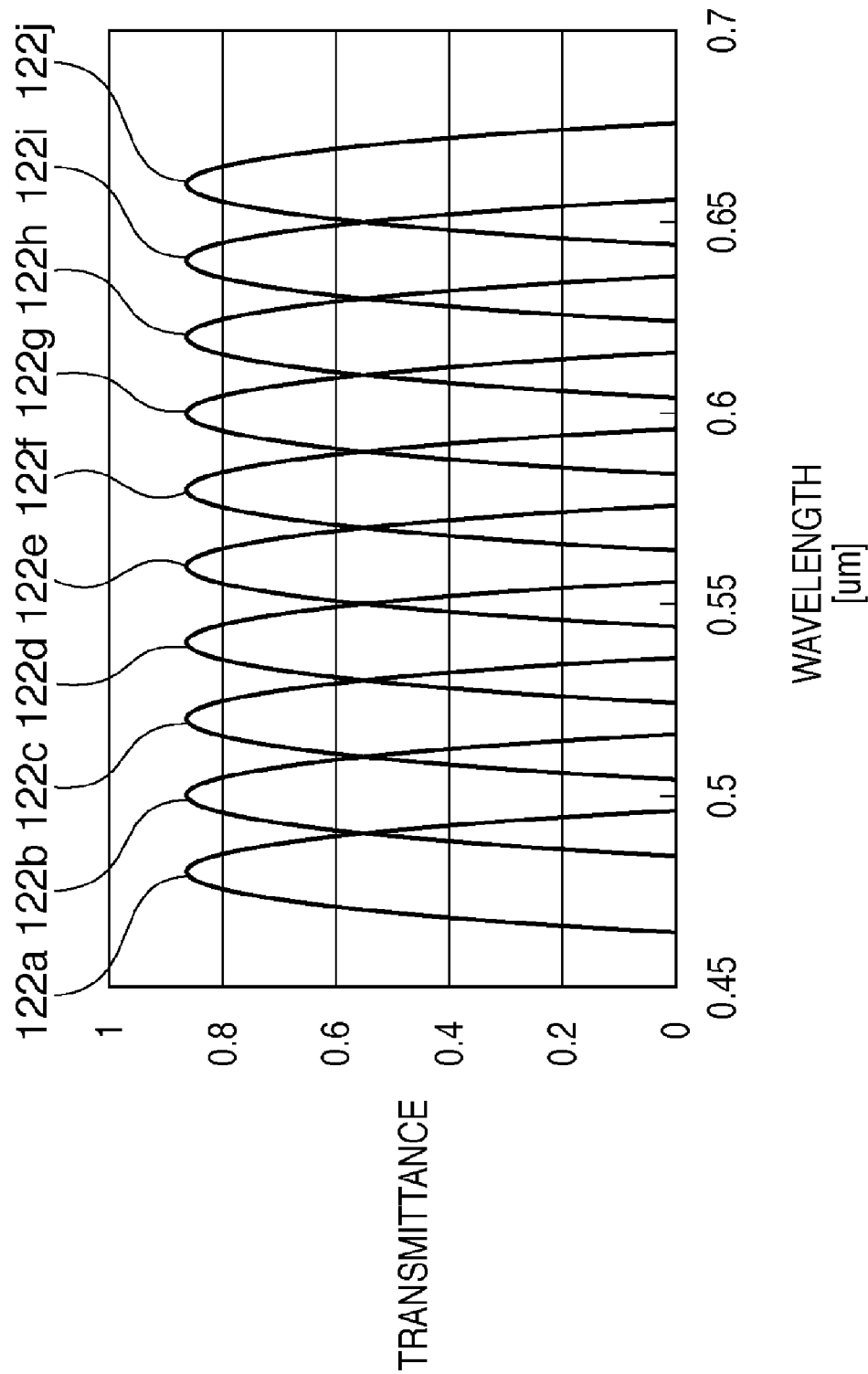

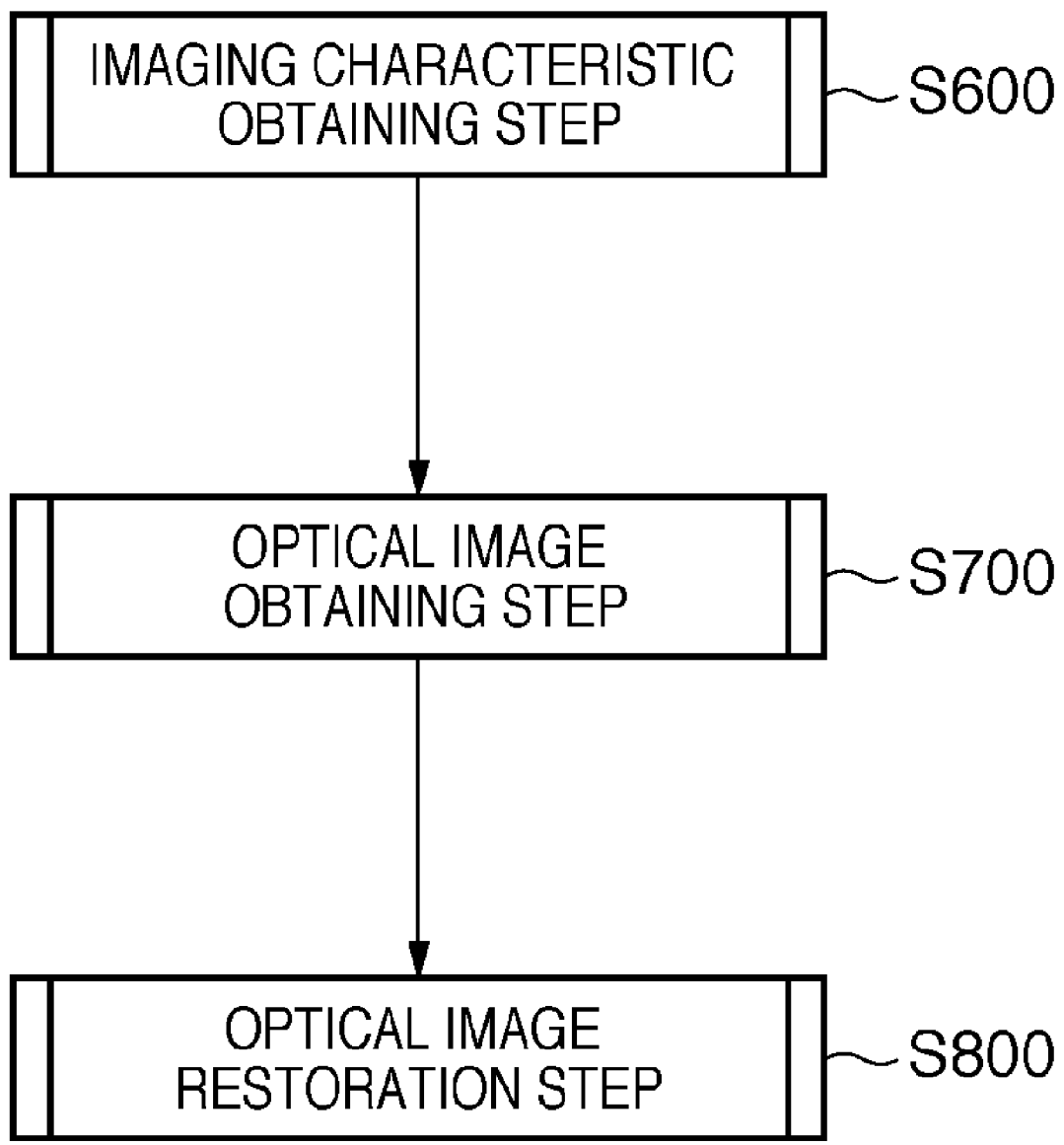

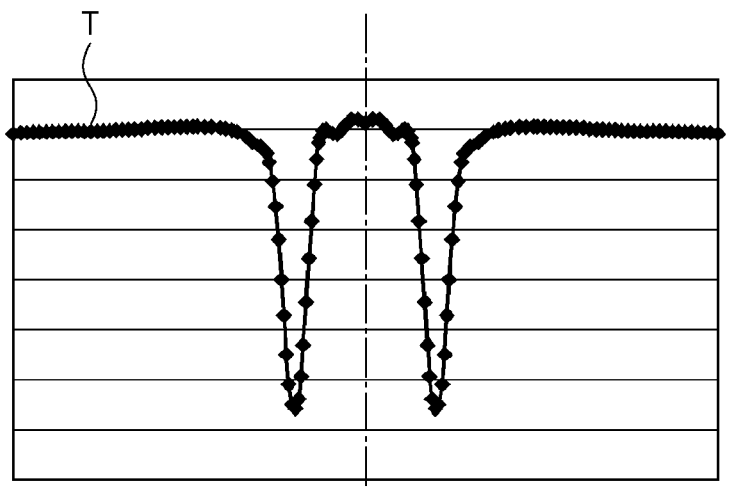
F I G. 11A
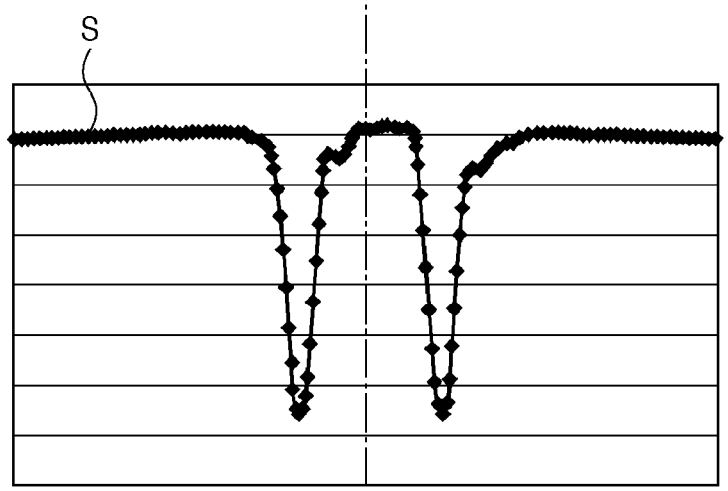
F I G. 11B
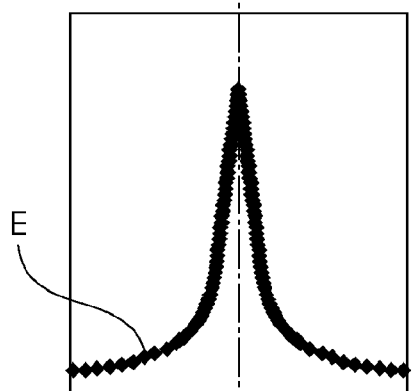
F I G. 11C

F I G. 12
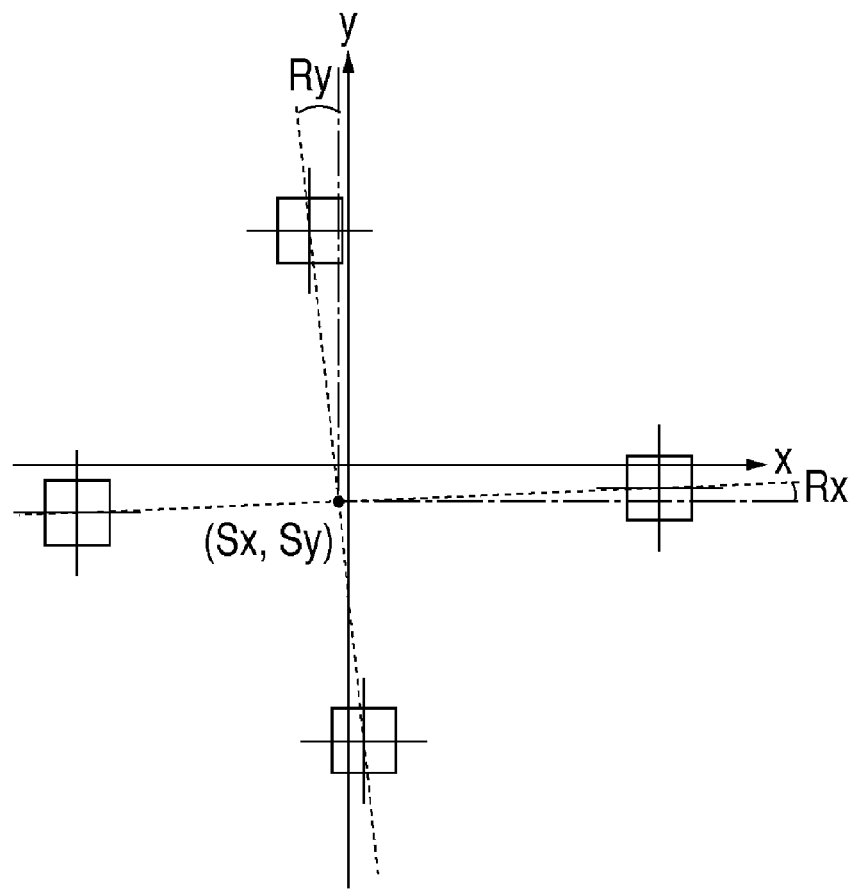
F I G. 13
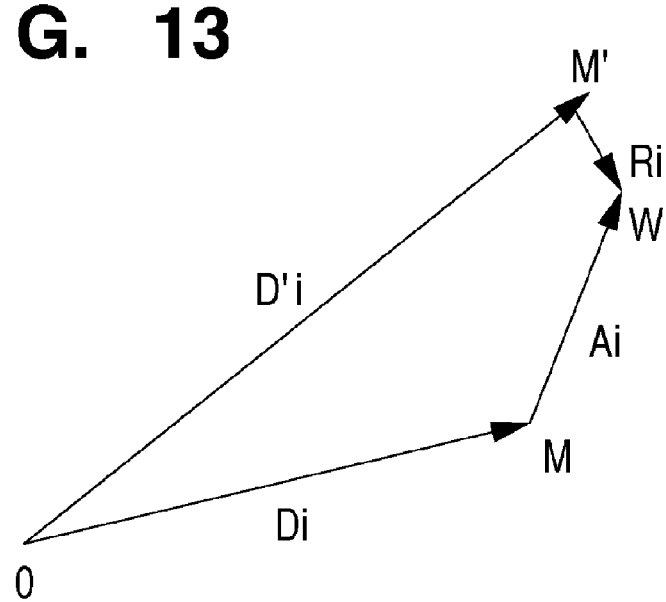

US 8,089,612 B2

POSITION DETECTION APPARATUS, POSITION DETECTION METHOD, EXPOSURE APPARATUS, AND DEVICE FABRICATION METHOD

BACKGROUND OF THE INVENTION

1. Field of the Invention

The present invention relates to a position detection apparatus, a position detection method, an exposure apparatus, and a device fabrication method.

2. Description of the Related Art

A projection exposure apparatus has conventionally been employed to fabricate a micropatterned semiconductor device such as a semiconductor memory or logic circuit by using photolithography. The projection exposure apparatus projects and transfers a circuit pattern formed on a reticle (mask) onto a substrate such as a wafer by a projection optical system.

To keep up with demands for advances in micropatterning of semiconductor devices, the projection exposure apparatus is being required to improve the resolving power (a minimum feature size that it can transfer). Along with this trend, the wavelength of the exposure light is shortening, high-NA projection optical systems are under development (the numerical aperture (NA) of the projection optical system is increasing), and the exposure region is widening.

Along with advances in micropatterning of semiconductor devices, the projection exposure apparatus is also being required to align the reticle and the wafer with an accuracy as high as ⅓ the line width of the circuit pattern. For example, a typical current circuit designed to have a line width of 90 nm must be aligned with an accuracy of 30 nm.

The exposure apparatus performs the alignment by transferring an alignment mark onto a wafer, together with the circuit pattern, and detects the position of the alignment mark in transferring the next circuit pattern onto the wafer, thereby aligning the wafer with the reticle. The alignment mark transferred onto the wafer is optically detected by, for example, a position detection apparatus (image sensing apparatus) 1000 as shown in FIG. 21. FIG. 21 is a schematic view showing a conventional position detection apparatus 1000.

In the position detection apparatus 1000, light emitted by a light source 1002 is deflected by a beam splitter 1004, and illuminates an alignment mark (target object) 1010, which is transferred onto a wafer 1008, via an imaging optical system 1006. The light reflected by the alignment mark 1010 forms an image on an image sensor 1012 via the imaging optical system 1006, and is sensed by the image sensor 1012 as the optical image (light intensity distribution) of the alignment mark 1010.

A known technique corrects deterioration in the optical image (light intensity distribution) of the alignment mark 1010 attributed to the optical system of the position detection apparatus 1000, and restores an optical image of the alignment mark 1010 by measuring the optical transfer function of the imaging optical system 1006 in advance and using an inverse filter. For example, letting f(x) be the optical image (light intensity distribution) of the light reflected by the alignment mark 1010, g(x) be the optical image (light intensity distribution) on the image sensor 1012, and H(ω) be the optical transfer function of the imaging optical system 1006, we have:

$$G(\omega) = H(\omega) \times F(\omega) \quad (1)$$

where G(ω) is the Fourier transform of g(x), F(ω) is the Fourier transform of f(x), and H(ω) is the Fourier transform of a point image distribution function (PSF: Point Spread Function) or a line image distribution function (LSF: Line Spread Function) and represents the imaging characteristic of the imaging optical system 1006.

Equation (1) is rewritten as:

$$F(\omega) = G(\omega) \times 1/H(\omega) \quad (2)$$

Inverse Fourier transformation of equation (2) yields an optical image before it deteriorates due to the optical system of the position detection apparatus 1000, that is, the optical image f(x) of the light reflected by the alignment mark 1010.

To increase the accuracy of the position detection apparatus, Japanese Patent Laid-Open No. 2004-281904 proposes a technique of measuring, for example, the optical transfer function and electrical transfer function of the position detection apparatus in advance, thereby correcting deterioration in the optical image (light intensity distribution) using these two transfer functions.

Unfortunately, in the prior art, if the reflectance of a target object such as an alignment mark has a wavelength dependence, it is impossible to satisfactorily correct deterioration in the optical image (light intensity distribution) attributed to the optical system of the position detection apparatus, resulting in a decrease in the detection accuracy of the target object.

For example, first, the prior art measures, using broadband light as the illumination light, the PSF or LSF over the entire wavelength width of the illumination light. Next, deterioration in the optical image is corrected using an optical transfer function G(ω) as the Fourier transform of the PSF or LSF. Note that the optical transfer function G(ω) which includes the information of the influence of aberrations in the optical system has a wavelength dependence. This is because aberrations (for example, an on-axis chromatic aberration) in the optical system generally differ in their generation amounts (aberration amounts) among wavelengths. For this reason, if differences in light intensity occur among wavelengths between when the PSF or LSF is measured and when a target object such as an alignment mark is measured, it is impossible to satisfactorily correct deterioration in the optical image (light intensity distribution).

In addition, as the wafer has a stacked structure in which transparent thin films such as a resist and interlayer dielectric film are stacked, the reflectance with respect to each wavelength varies, as shown in FIG. 22. FIG. 22 is a graph showing the wavelength dependence of the reflectance of the wafer (alignment mark) serving as the target object. In FIG. 22, the ordinate indicates the reflectance of the wafer, and the abscissa indicates the wavelength of light which illuminates the wafer. To reduce the influence of multiple reflection by these transparent thin films, the position detection apparatus illuminates the wafer with illumination light having a wavelength width, and detects the position of the alignment mark transferred onto the wafer. However, Japanese Patent Laid-Open No. 2004-281904 does not take account of the wavelength dependence of the reflectance of the wafer (alignment mark). Therefore, even when the PSF or LSF is calculated over the entire wavelength width of the illumination light, and an optical transfer function G(ω) as its Fourier transform is used, the optical image (light intensity distribution) changes depending on the wavelength. This makes it impossible to satisfactorily correct deterioration in the optical image.

SUMMARY OF THE INVENTION

The present invention provides a position detection apparatus which can accurately detect the position of a target object.

According to the first aspect of the present invention, there is provided a position detection apparatus which detects a position of a target object, the apparatus comprising a light source configured to emit light having a wavelength width onto the target object, an imaging optical system configured to form an image of the light from the target object on an image sensor, a first obtaining unit configured to obtain imaging characteristics of the imaging optical system for a plurality of light beams, having different wavelength with each other, of the light having the wavelength width, a second obtaining unit configured to obtain optical images of the target object for the plurality of the light beams, a restoration unit configured to restore optical images of the target object for the plurality of the light beams by correcting, deterioration in the optical images of the target object obtained by the second obtaining unit attributed to the imaging optical system, based on the imaging characteristics of the imaging optical system obtained by the first obtaining unit, a generation unit configured to generate an optical image of the target object for light including the plurality of the light beams by synthesizing the optical images of the target object for the plurality of the light beams, which are restored by the restoration unit, and a determination unit configured to determine the position of the target object based on the optical image of the target object for the light including the plurality of the light beams, which is generated by the generation unit.

Further features of the present invention will become apparent from the following description of exemplary embodiments with reference to the attached drawings.

BRIEF DESCRIPTION OF THE DRAWINGS

FIG. 3 is a graph showing the spectral characteristics of a plurality of bandpass filters of the wavelength selection unit shown in FIG. 2.

FIGS. 4A and 4B are flowcharts for explaining a position detection method according to one aspect of the present invention.

FIGS. 11A to 11C are charts for explaining a template matching method.

FIG. 12 is a view showing a misalignment of the shot array on the wafer with respect to the x-y coordinate system on a wafer stage of the exposure apparatus shown in FIG. 1.

FIG. 13 is a diagram schematically showing, using vectors, a linear coordinate transform shown in equation (15).

DESCRIPTION OF THE EMBODIMENTS

Figure 1:
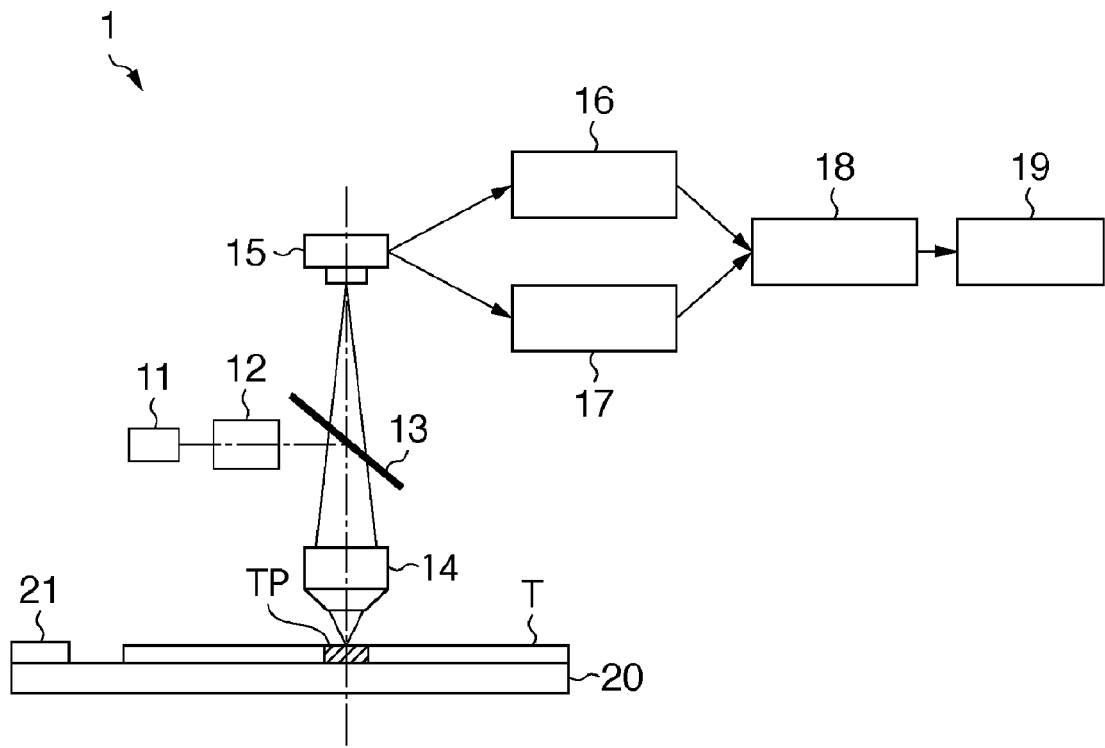
FIG. 1 is a schematic view showing a position detection apparatus according to one aspect of the present invention.

Preferred embodiments of the present invention will be described below with reference to the accompanying drawings. The same reference numerals denote the same members throughout the drawings, and a repetitive description thereof will not be given.

FIG. 1 is a schematic view showing a position detection apparatus 1 according to one aspect of the present invention. The position detection apparatus 1 detects the position of a target object T (target pattern TP).

The position detection apparatus 1 includes a light source 11, wavelength selection unit 12, beam splitter 13, imaging optical system 14, image sensor 15, first storage unit 16, second storage unit 17, calculation unit 18, output unit 19, stage 20, and imaging characteristic obtaining pattern 21.

The light source 11 is, for example, a halogen lamp and emits light having a wavelength width (i.e., broadband light).

Figure 2:
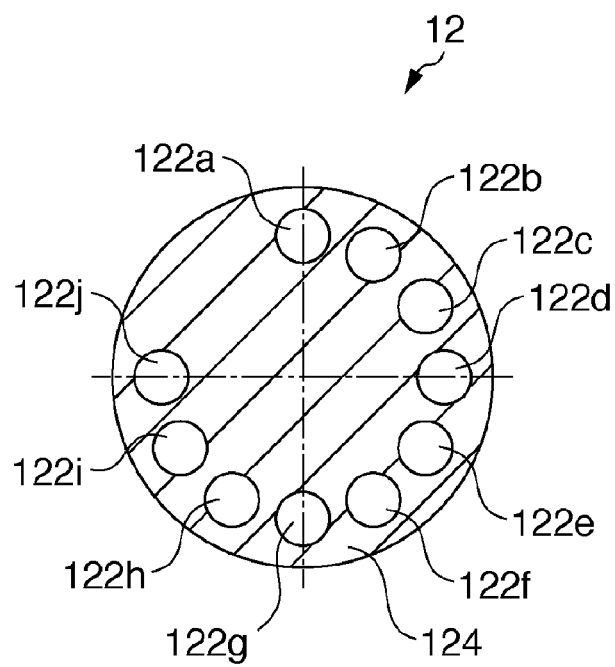
FIG. 2 is a schematic view showing the detailed configuration of a wavelength selection unit in the position detection apparatus shown in FIG. 1.

The wavelength selection unit 12 selectively passes light beams having predetermined wavelengths (light beams having a plurality of different wavelengths) of the light which has a wavelength width and is emitted by the light source 11. The wavelength selection unit 12 includes a plurality of bandpass filters 122a to 122j which pass light beams having a plurality of wavelengths, and a turret 124 which exchangeably inserts the bandpass filters 122a to 122j into the optical path between the light source 11 and the target object T, as shown in FIG. 2. The bandpass filters 122a to 122j exhibit, for example, characteristics having a transmission wavelength width of about 30 nm and transmission center wavelengths shifted from each other by 20 nm, as shown in FIG. 3. The target object T can be illuminated with light having an arbitrary wavelength by inserting an arbitrary one of the bandpass filters 122a to 122j into the optical path by rotating the turret 124 in the wavelength selection unit 12. Note that FIG. 2 is a schematic view showing the detailed configuration of the wavelength selection unit 12. FIG. 3 is a graph showing the spectral characteristics of the plurality of bandpass filters 122a to 122j of the wavelength selection unit 12.

The wavelength selection unit 12 is not particularly limited to the configuration shown in FIG. 2. For example, a bandpass filter manufactured by a combination of a birefringent plate and a ferroelectric liquid crystal cell may be used. Also, the function of the wavelength selection unit 12 may be imparted to the light source 11 by, for example, using a Ti-sapphire laser having a variable wavelength or an optical frequency comb generator for the light source 11, or constituting the light source 11 by a plurality of light sources which emit light beams having different wavelengths.

The beam splitter 13 reflects the light having passed through the wavelength selection unit 12 to the target object T (target pattern TP) or the imaging characteristic obtaining pattern 21. Also, the beam splitter 13 transmits the light from the target object T (target pattern TP) or the imaging characteristic obtaining pattern 21 to the image sensor 15.

The imaging optical system 14 guides the light from the target pattern TP on the target object T or the imaging characteristic obtaining pattern 21 onto the image sensor 15 to form an optical image (light intensity distribution) of the target pattern TP or the imaging characteristic obtaining pattern 21 on the image sensor 15.

The image sensor 15 senses the optical image of the target pattern TP or the imaging characteristic obtaining pattern 21 formed by the imaging optical system 14.

The first storage unit 16 stores point image distribution functions $PSF(\lambda)$ or line image distribution functions $LSF(\lambda)$ of the imaging optical system 14 as the imaging characteristics of the imaging optical system 14 for the plurality of different wavelengths $\lambda$ selected by the wavelength selection unit 12.

The second storage unit 17 stores optical images $g(\lambda)$ of the target pattern TP for the plurality of different wavelengths $\lambda$ selected by the wavelength selection unit 12. Note that the optical images $g(\lambda)$ of the target pattern TP stored in the second storage unit 17 include deterioration attributed to the imaging optical system 14.

The calculation unit 18 corrects the deterioration in the optical images $g(\lambda)$ attributed to the imaging optical system 14 based on the point image distribution functions $PSF(\lambda)$ or the line image distribution functions $LSF(\lambda)$, thereby restoring optical images $f(\lambda)$ of the target pattern TP for the plurality of wavelengths $\lambda$. Also, the calculation unit 18 composites the restored optical images $f(\lambda)$ to generate an optical image of the target pattern TP for light including the plurality of wavelengths $\lambda$, and determines the position of the target object T (target pattern TP) based on the optical image of the target pattern TP. In this manner, the calculation unit 18 serves as a restoration unit which restores an optical image of the target pattern TP, a generation unit which generates an optical image of the target pattern TP for light having an arbitrary wavelength, and a determination unit which determines the position of the target pattern TP (target object T).

The output unit 19 outputs or displays the optical image of the target pattern TP generated (calculated) by the calculation unit 18.

The stage 20 holds the target object T and the imaging characteristic obtaining pattern 21, and drives the target object T (target pattern TP) or the imaging characteristic obtaining pattern 21 beneath the imaging optical system 14.

The imaging characteristic obtaining pattern 21 is a pattern to obtain the imaging characteristics of the imaging optical system 14 (the point image distribution functions $PSF(\lambda)$ or line image distribution functions $LSF(\lambda)$ of the imaging optical system 14), and includes, for example, a slit pattern or a pinhole pattern. For example, if the target pattern TP is a two-dimensional pattern, a pinhole pattern is used as the imaging characteristic obtaining pattern 21 in order to obtain the point image distribution functions $PSF(\lambda)$ as the imaging characteristics of the imaging optical system 14. If the target pattern TP is a one-dimensional pattern (a pattern which changes along the x-axis and is constant along the y-axis), a slit pattern whose slit width direction is the x-axis direction is used as the imaging characteristic obtaining pattern 21 in order to obtain the line image distribution functions $LSF(\lambda)$ as the imaging characteristics of the imaging optical system 14.

The point image distribution functions $PSF(\lambda)$ or the line image distribution functions $LSF(\lambda)$ of the imaging optical system 14 can be obtained (measured) by a method known to those skilled in the art. To obtain the point image distribution function $PSF(\lambda)$, it is only necessary to form, on the image sensor 15 via the imaging optical system 14, an image of light reflected by or transmitted through a pinhole pattern serving as the imaging characteristic obtaining pattern 21, and to sense the optical image (light intensity distribution). To obtain the line image distribution function $LSF(\lambda)$, it is only necessary to form, on the image sensor 15 via the imaging optical system 14, an image of light reflected by or transmitted through a slit pattern serving as the imaging characteristic obtaining pattern 21, and to sense the optical image (light intensity distribution). A diameter d of the pinhole pattern or a slit width d of the slit pattern used as the imaging characteristic obtaining pattern 21, and the numerical aperture NA of the imaging optical system 14 satisfy:

$$d < \frac{1}{2} \cdot \lambda / NA \quad (3)$$

For the sake of descriptive convenience, this embodiment will exemplify a case in which the target pattern TP is a one-dimensional pattern, and the line image distribution functions $LSF(\lambda)$ are used as the imaging characteristics of the imaging optical system 14. If the target pattern TP is a two-dimensional pattern, the following description need only be applied to the point image distribution functions $PSF(\lambda)$ assuming the y-axis as well as the x-axis.

Figure 4B:
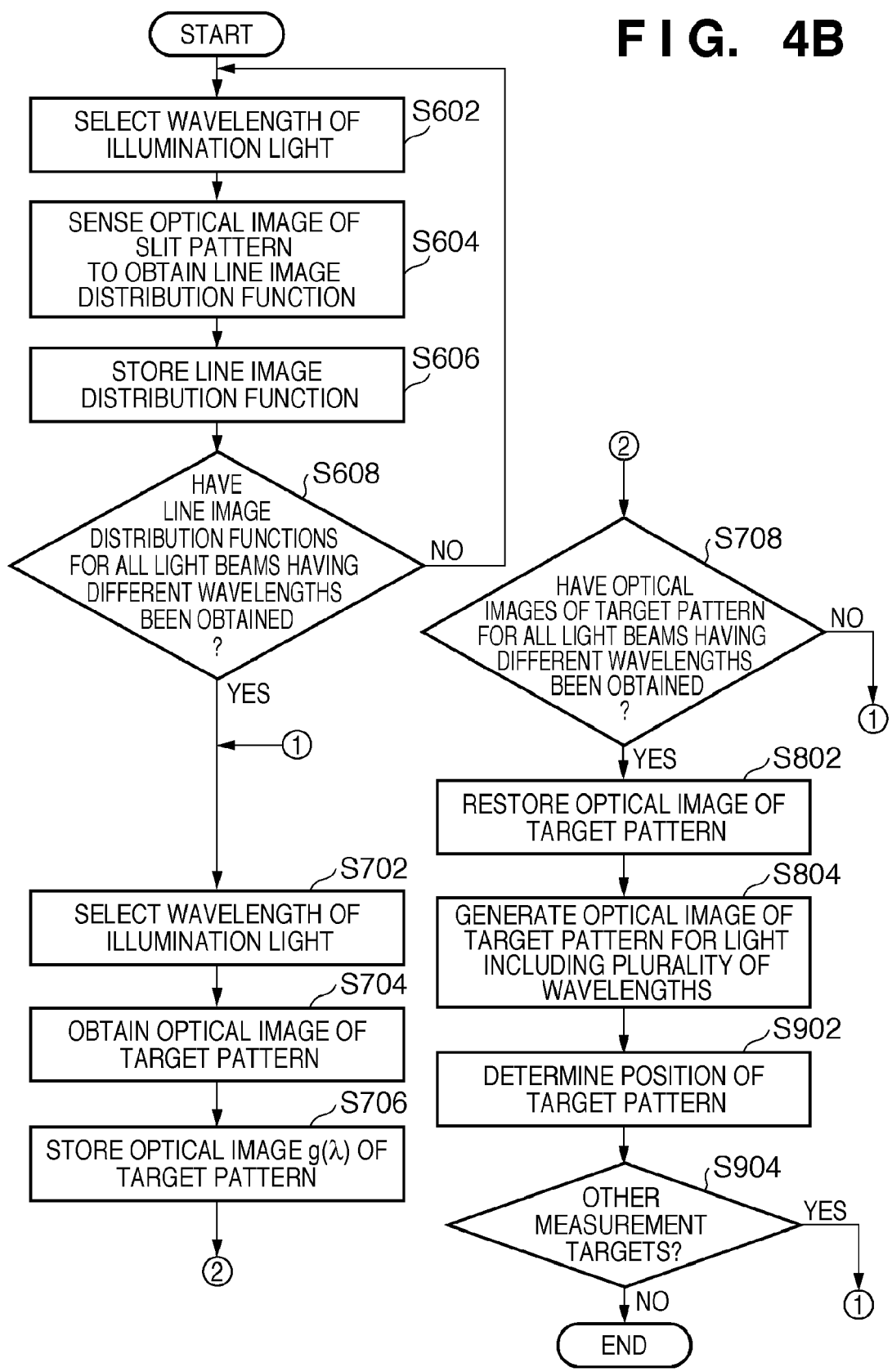

The operation of the position detection apparatus 1, that is, a position detection method in the position detection apparatus 1 will be explained herein. FIGS. 4A and 4B are flowcharts for explaining a position detection method according to one aspect of the present invention.

The position detection method in the position detection apparatus 1 is roughly divided into three steps: an imaging characteristic obtaining step (S600), an optical image obtaining step (S700), and an optical image restoration step (S800), as shown in FIG. 4A. In the imaging characteristic obtaining step (S600) as a first obtaining step, the imaging characteristics (in this embodiment, the line image distribution functions $LSF(\lambda)$) of the imaging optical system 14 are obtained (measured). In the optical image obtaining step (S700) as a second obtaining step, the optical images of the target pattern TP on the target object T are obtained (measured). In the optical image restoration step (S800), optical images of the target pattern TP are restored by correcting deterioration in the optical images of the target pattern TP attributed to the imaging optical system 14.

The above-mentioned three steps (the imaging characteristic obtaining step (S600), optical image obtaining step (S700), and optical image restoration step (S800)) will be explained in detail below with reference to FIG. 4B.

In the imaging characteristic obtaining step (S600), a reflective slit pattern serving as the imaging characteristic obtaining pattern 21 is arranged beneath the imaging optical system 14 through the stage 20 in order to obtain (measure) the line image distribution functions $LSF(\lambda)$ of the imaging optical system 14. Hence, the light source 11, wavelength selection unit 12, beam splitter 13, imaging optical system 14, image sensor 15, and imaging characteristic obtaining pattern 21 serve as a first obtaining unit for obtaining the imaging characteristics of the imaging optical system 14.

In step S602, a wavelength λ1 of light (illumination light) which illuminates the slit pattern serving as the imaging characteristic obtaining pattern 21 is selected by the wavelength selection unit 12.

In step S604, the slit pattern is illuminated with a light beam having the wavelength λ1 selected in step S602, and the optical image of the slit pattern is sensed by the image sensor 15, thereby obtaining a line image distribution function LSF (λ1).

In step S606, the line image distribution function LSF(λ1) obtained in step S604 is stored in the first storage unit 16.

In step S608, it is checked whether the line image distribution functions LSF for all light beams having different wavelengths which can be selected by the wavelength selection unit 12 (in this embodiment, light beams which pass through the bandpass filters 122a to 122j) have been obtained. If it is determined that the line image distribution functions LSF for all light beams having different wavelengths which can be selected by the wavelength selection unit 12 have been obtained, the process advances to the optical image obtaining step (S700). On the other hand, if it is determined that the line image distribution functions LSF for all light beams having different wavelengths which can be selected by the wavelength selection unit 12 have not yet been obtained, the process returns to step S602, and the next wavelength λ2 is selected by the wavelength selection unit 12, and steps S604 and S606 are executed.

Figure 5:
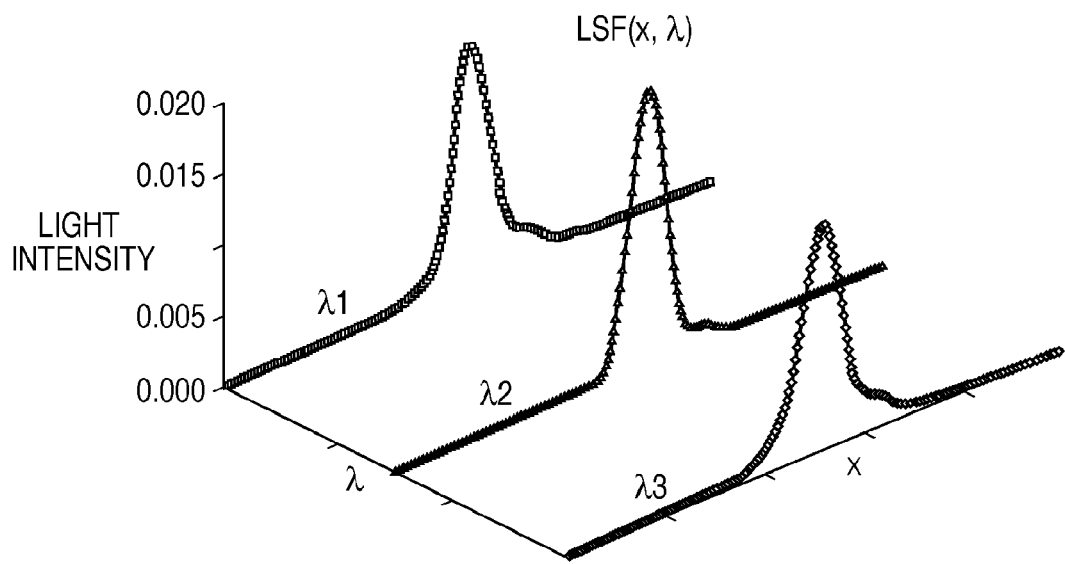
FIG. 5 is a graph showing an example of the line image distribution functions of an imaging optical system obtained in an imaging characteristic obtaining step.

FIG. 5 shows an example of line image distribution functions LSF(x, λ) of the imaging optical system 14 obtained in the imaging characteristic obtaining step (S600) in this way. Although FIG. 5 shows only line image distribution functions LSF(x, λ) for light beams having the wavelengths λ1 to λ3, line image distribution functions LSF(x, λ) for light beams having the wavelengths λ1 to λn (in this embodiment, n=10) are stored in the first storage unit 16. Referring to FIG. 5, obviously, the line image distribution function LSF(x, λ) along the x-axis changes for each wavelength.

In the optical image obtaining step (S700), the target pattern TP is arranged beneath the imaging optical system 14 through the stage 20 in order to obtain (measure) the optical images of the target pattern TP. Hence, the light source 11, wavelength selection unit 12, beam splitter 13, imaging optical system 14, image sensor 15, and target pattern TP serve as a second obtaining unit for obtaining the optical images of the target pattern TP.

In step S702, a wavelength λ1 of light (illumination light) which illuminates the target pattern TP is selected by the wavelength selection unit 12.

In step S704, the target pattern TP is illuminated with a light beam having the wavelength λ1 selected in step S702, and the optical image of the target pattern TP is sensed by the image sensor 15, thereby obtaining an optical image g(λ1) of the target pattern TP.

In step S706, the optical image g(λ1) of the target pattern TP obtained in step S704 is stored in the second storage unit 17.

In step S708, it is checked whether the optical images of the target pattern TP for all light beams having different wavelengths which can be selected by the wavelength selection unit 12 (in this embodiment, light beams which pass through the bandpass filters 122a to 122j) have been obtained. If it is determined that the optical images of the target pattern TP for all light beams having different wavelengths which can be selected by the wavelength selection unit 12 have been obtained, the process advances to the restoration step (S800). On the other hand, if it is determined that the optical images of the target pattern TP for all light beams having different wavelengths which can be selected by the wavelength selection unit 12 have not yet been obtained, the process returns to step S702, and the next wavelength λ2 is selected by the wavelength selection unit 12, and steps S704 and S706 are executed.

Figure 6:
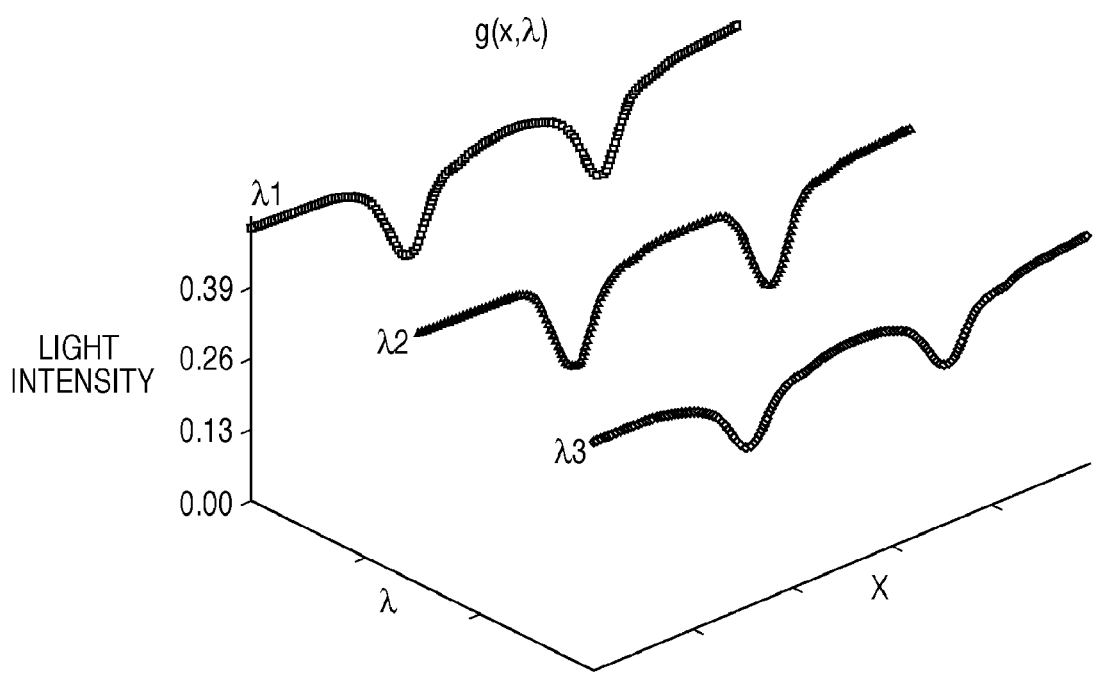
FIG. 6 is a graph showing an example of the optical images of a target pattern obtained in an optical image obtaining step.

FIG. 6 shows an example of optical images g(x, λ) of the target pattern TP obtained in the optical image obtaining step (S700) in this way. Although FIG. 6 shows only optical images g(x, λ) of the target pattern TP for light beams having the wavelengths λ1 to λ3, optical images g(x, λ) of the target pattern TP for light beams having the wavelengths λ1 to λn (in this embodiment, n=10) are stored in the second storage unit 17. Referring to FIG. 6, obviously, the optical image g(x, λ) of the target pattern TP along the x-axis changes for each wavelength.

The optical image restoration step (S800) is mainly executed by the calculation unit 18.

In step S802, deterioration in the optical images g(x, λ) of the target pattern TP stored in the second storage unit 17 attributed to the imaging optical system 14 is corrected using the line image distribution functions LSF(x, λ) stored in the first storage unit 16, thereby restoring optical images f(λ) of the target pattern TP. Note that optical images f(λ) of the target pattern TP for light beams having a plurality of wavelengths λ (in this embodiment, λ1 to λ10) are restored in step S802. More specifically, the calculation unit 18 executes the following arithmetic process.

First, the line image distribution functions LSF(x, λ) stored in the first storage unit 16 are Fourier-transformed by:

$$H(\omega, \lambda) = \int_{-\infty}^{+\infty} LSF(x, \lambda)\exp(-i\omega x)\,dx \qquad (4)$$

Also, the optical images g(x, λ) of the target pattern TP stored in the second storage unit 17 are Fourier-transformed by:

$$G(\omega, \lambda) = \int_{-\infty}^{+\infty} g(x, \lambda)\exp(-i\omega x)\,dx \qquad (5)$$

Next, using inverse filters $H(\omega, \lambda)^{-1}$, $$F(\omega,\lambda)=G(\omega,\lambda)\times H(\omega,\lambda)^{-1} \qquad (6)$$

is calculated for light beams having a plurality of wavelengths λ.

Optical images f(x, λ) of the target pattern TP for light beams having a plurality of wavelengths λ are restored by inverse-Fourier-transforming equation (6) by:

$$f(x, \lambda) = \frac{1}{2\pi}\int_{-\infty}^{+\infty} F(\omega, \lambda)\exp(-i\omega x)\,d\omega \qquad (7)$$

In step S804, the optical images f(x, λ) of the target pattern TP restored in step S802 are composited to generate an optical image of the target pattern TP for light including a plurality of wavelengths λ. The thus generated optical image of the target pattern TP is output from or displayed on the output unit 19.

In the process of step S804, an optical image of the target pattern TP corresponding to a color image, for example, can be generated using the optical images f(x, λ) of the target pattern TP for light beams having a plurality of wavelengths λ. More specifically, it is only necessary to integrate the light intensity values (luminances) at wavelengths belonging to the wavelength ranges of a color filter (e.g., the R (red), G (green), and B (blue) wavelength ranges) for each point (each pixel on the image sensor 15) obtained from equation (7) to generate an optical image of the target pattern TP. By sending the optical image of the target pattern TP to a liquid crystal device serving as the output unit 19, it can be displayed as a color image.

If an optical image of the target pattern TP corresponding to a gray image is to be generated, an average optical image ff(x) of the target pattern TP for light beams having a plurality of wavelengths λ (in this embodiment, λ1 to λ10):

$$ff(x) = \frac{1}{n} \sum_{\lambda 1}^{\lambda n} f(x, \lambda) \qquad (8)$$

can be generated.

In step S902, the position of the target pattern TP (target object T) is determined using a method known to those skilled in the art from the optical image (given by, e.g., equation (8)) of the target pattern TP generated in step S804.

In step S904, it is checked whether there are other measurement targets. If it is determined that there are other measurement targets, the process returns to step S702, and steps S702 to S804 are repeated. On the other hand, if it is determined that there are no more measurement targets, the position detection method in the position detection apparatus 1 ends.

The spectral sensitivity characteristic of the image sensor 15 changes for each wavelength, so the sensitivity of the image sensor 15 is preferably calibrated in advance. The differences among wavelengths in the transmittances of the bandpass filters 122a to 122j used in the wavelength selection unit 12 are also preferably calibrated.

Because the value of the optical transfer function H(ω) is close to zero on the high-frequency side, the power of 1/H(ω) on the high-frequency side relatively rises. This often generates high-frequency ripples in the restored optical images (images) of the target pattern TP. In this case, 1/H(ω) may be set to zero at frequencies at which the value of the optical transfer function H(ω) is close to zero, and the amplitude components on the high-frequency side may be relatively decreased using a window function symmetrical about zero frequency. The window function can be, for example, a rectangular window, Hanning window, or Gaussian window.

Although optical images f(λ) of the target pattern TP for light beams having a plurality of wavelengths are restored using Fourier transformation in this embodiment, they can also be restored without Fourier transformation. The right side of equation (1) is the product in the frequency domain. From the characteristics of Fourier transformation, equation (1) is equivalent to a convolution in the real-space domain:

$$g(x) = \int_{-\infty}^{+\infty} h(\tau) f(x - \tau) d\tau = h(x) * f(x) \qquad (9)$$

where * is the symbol of convolution operation, and h(x) is the inverse Fourier transform of the optical transfer function of the imaging optical system 14, that is, the point image distribution function PSF or the line image distribution function LSF.

Deconvolution need only be executed using the optical images g(x, λ) of the target pattern TP obtained in step S704 by substituting the line image distribution functions LSF(x, λ) obtained in step S604 to h(x) in equation (9). This makes it possible to restore optical images f(λ) of the target pattern TP, for which deterioration attributed to the imaging optical system 14 is corrected.

The position detection apparatus 1 according to this embodiment can correct deterioration in the optical images of the target pattern TP attributed to the imaging optical system 14 for respective wavelengths. In other words, even when the reflectance of the target pattern TP changes for each wavelength, the position detection apparatus 1 can accurately restore optical images of the target pattern TP for light beams having a plurality of wavelengths. Hence, the position detection apparatus 1 can accurately detect the position of the target pattern TP (target object T) by compositing (synthesizing) the accurately restored optical images of the target pattern TP to generate an optical image of the target pattern TP for light including a plurality of wavelengths.

An exposure apparatus to which the above-mentioned position detection apparatus 1 is applied will be explained next. The position detection apparatus 1 is applied to, for example, an alignment detection system (position detection system) which detects the position of an alignment mark formed on a substrate such as a wafer in the exposure apparatus.

Figure 7:
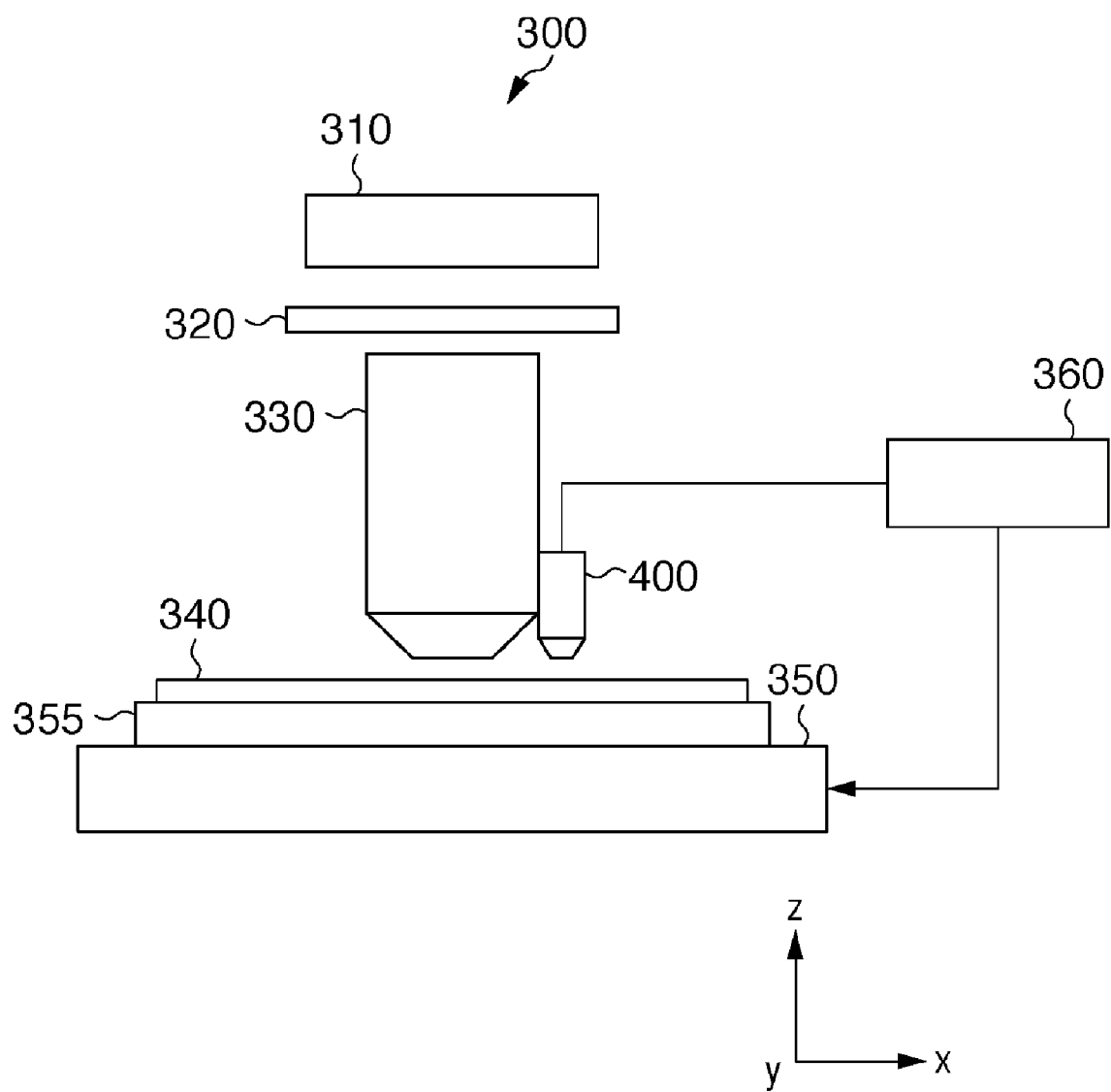
FIG. 7 is a schematic view showing an exposure apparatus according to one aspect of the present invention.

FIG. 7 is a schematic view showing an exposure apparatus 300 according to one aspect of the present invention. The exposure apparatus 300 is a projection exposure apparatus which transfers the pattern of a reticle onto a wafer by exposure using the step & scan scheme or the step & repeat scheme. However, the exposure apparatus 300 is also applicable to a nanoimprint apparatus.

The exposure apparatus 300 includes an illumination apparatus 310, a reticle stage (not shown) which supports a reticle 320, a projection optical system 330, a wafer stage 350 which supports a wafer 340, a control unit 360, and an alignment detection system 400, as shown in FIG. 7.

The illumination apparatus 310 includes a light source such as an ArF excimer laser, KrF excimer laser, $F_2$ laser, or EUV (Extreme Ultra Violet) light source, and an illumination optical system which illuminates the reticle 320 with light from the light source.

The reticle 320 has a circuit pattern and is supported and driven by the reticle stage (not shown).

The projection optical system 330 projects the pattern of the reticle 320 onto the wafer 340.

The wafer 340 is a substrate onto which the pattern of the reticle 320 is projected (transferred). An underlying pattern and alignment mark are formed on the wafer 340 by a pre-process. It is also possible to use a glass plate or another substrate in place of the wafer 340.

The wafer stage 350 supports the wafer 340 through a wafer chuck 355, and drives the wafer 340 to align it at a predetermined position.

The control unit 360 includes, for example, a CPU and memory and controls the whole (operation) of the exposure apparatus 300. In this embodiment, the control unit 360 also serves as an adjusting unit which adjusts the position of the wafer 340 through the wafer stage 350 based on the detection result (the position of the wafer 340 or alignment mark AM) obtained by the alignment detection system 400.

The alignment detection system 400 detects the alignment mark on the wafer 340. Also, the alignment detection system 400 detects (determines) the position of the wafer 340 based on the detection result of the alignment mark.

Figure 8:
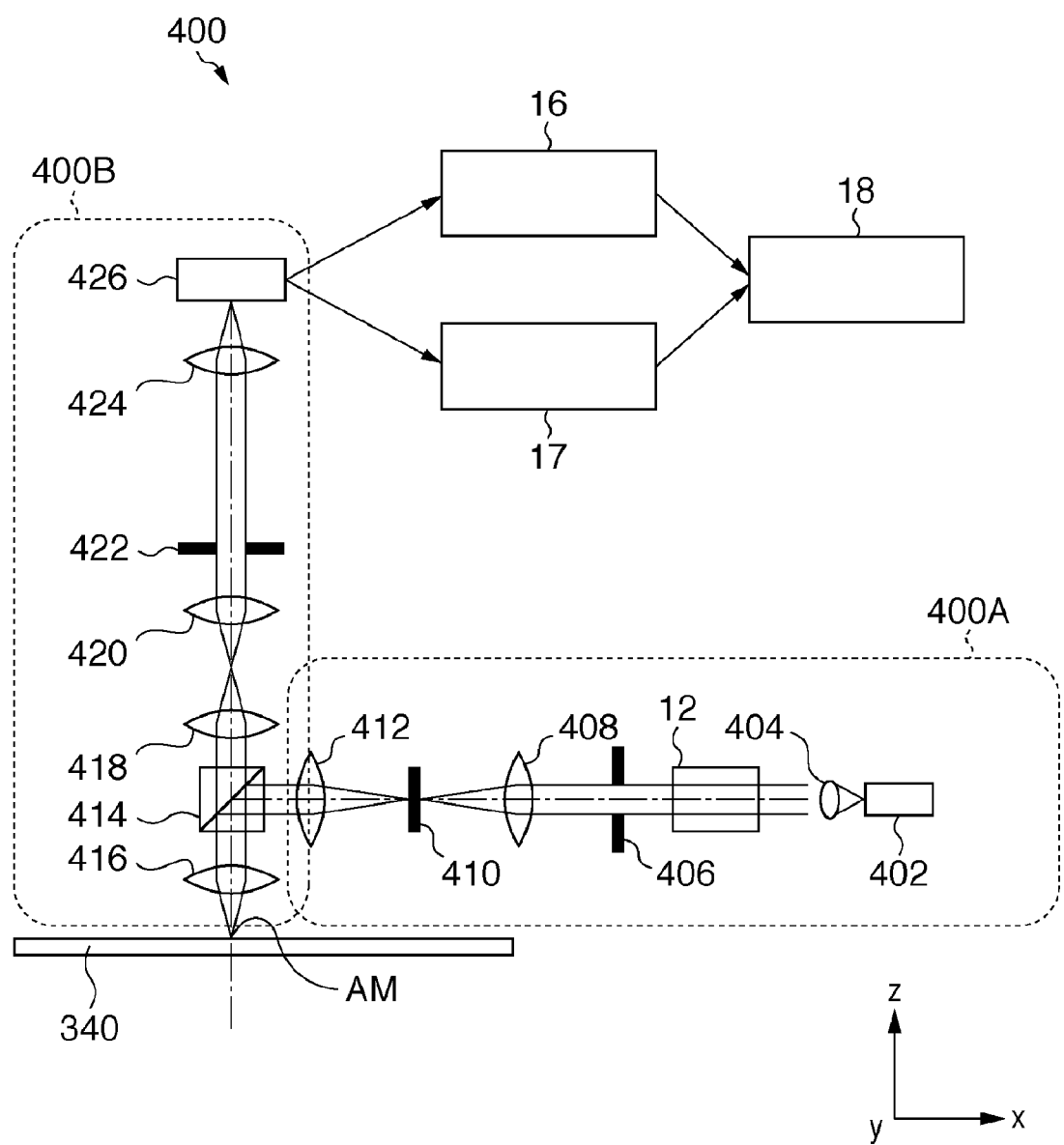
FIG. 8 is a schematic view showing an arrangement of an alignment detection system in the exposure apparatus shown in FIG. 1.

The arrangement and principle of the alignment detection system 400 will be explained in detail herein. FIG. 8 is a schematic view showing the alignment detection system 400. The alignment detection system 400 includes an illumination system 400A and imaging system 400B, as shown in FIG. 8. Note that FIG. 8 shows an example of an alignment detection system 400 which detects the position in the x-axis direction. To detect the position in the y-axis direction, it is only necessary to use an alignment detection system set by rotating the alignment detection system 400 shown in FIG. 8 through 90° about the z-axis, and an alignment mark set by rotating the mark in the x-axis direction through 90° about the z-axis.

Light from a light source 402 such as a halogen lamp is expanded into collimated light by a lens 404, and enters an aperture stop 406 via the wavelength selection unit 12 which selectively passes an arbitrary wavelength. The aperture stop 406 has a function of adjusting the coherency σ of light from the light source 402, and typically adjusts the coherency σ of light from the light source 402 to 0.9.

The light having passed through the aperture stop 406 is converged by a lens 408, and enters an aperture 410 arranged at a position optically conjugate to that of the wafer 340. The aperture 410 serves as a field stop which prevents any unnecessary light from illuminating the peripheral region of the alignment mark AM on the wafer 340.

The light having passed through the aperture 410 is expanded into collimated light by a lens 412, and reflected by a beam splitter 414. The light reflected by the beam splitter 414 illuminates the alignment mark AM on the wafer 340 via a lens 416.

The light reflected by the alignment mark AM enters an aperture stop 422, which adjusts the numerical aperture (NA) of the imaging system 400B, via the lens 416, the beam splitter 414, and lenses 418 and 420. The light having passed through the aperture stop 422 is converged by a lens 424, and sensed (received) by a line sensor 426. Note that the alignment mark AM is enlarged at an imaging magnification of about 100× in the imaging system 400B, and imaged on a line sensor 426.

Figure 9A:
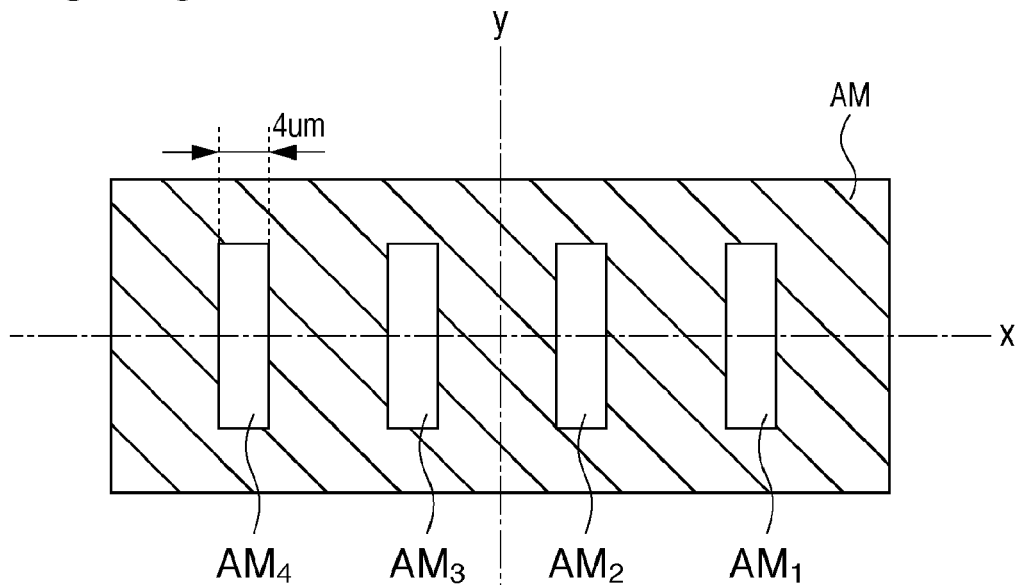
FIGS. 9A and 9B are views showing an example of an alignment mark on a wafer.
Figure 9B:
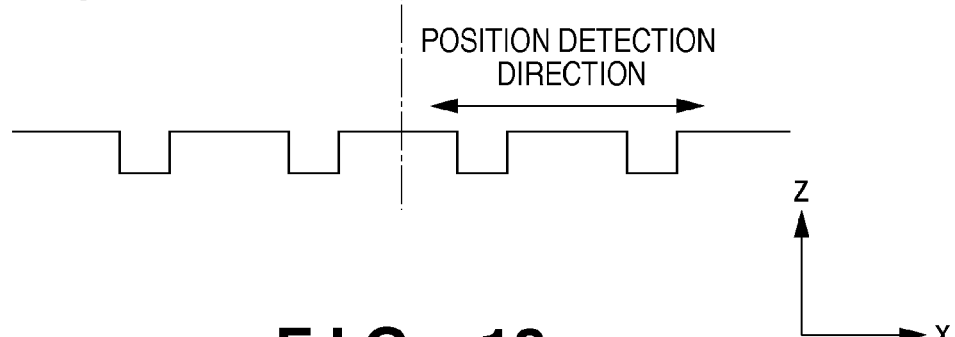

The alignment mark AM includes four rectangular marks $AM_1$ to $AM_4$ having a dimension of 4 μm in the x-axis direction as the position detection direction, and a dimension of 20 μm in the y-axis direction as the non-position detection direction, as shown in FIG. 9A. The marks $AM_1$ to $AM_4$ of the alignment mark AM have a recessed sectional structure formed by etching, as shown in FIG. 9B. Although not shown in FIGS. 9A and 9B, a resist is applied on the alignment mark AM in practice. FIGS. 9A and 9B are views showing an example of the alignment mark AM, in which FIG. 9A is a plan view and FIG. 9B is a sectional view.

Figure 10:
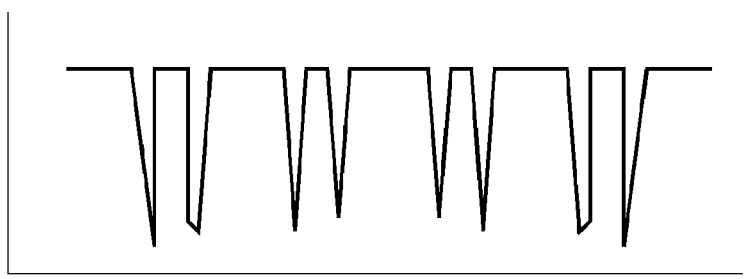
FIG. 10 is a chart showing the image (detection result) of the alignment mark sensed by a line sensor when the alignment mark shown in FIGS. 9A and 9B is used.

When the alignment mark AM shown in FIGS. 9A and 9B is used, light scattered at an angle that is too large to fall within the NA of the lens of the alignment detection system 400 is often generated at the edge portion, or scattered light beams generated at the edge portion often interfere with each other, so the line sensor 426 senses an optical image as shown in FIG. 10. FIG. 10 is a chart showing the optical image (detection result) of the alignment mark AM sensed by the line sensor 426 when the alignment mark AM shown in FIGS. 9A and 9B is used. As shown in FIG. 10, the optical image of the alignment mark AM sensed by the line sensor 426 is known to have an asymmetry, which changes for each wavelength of light which illuminates the alignment mark AM.

To reduce the asymmetry, the line image distribution functions and the optical images of the alignment mark AM for light beams having a plurality of wavelengths which can be selected by the wavelength selection unit 12 are obtained based on the position detection method shown in FIGS. 4A and 4B. To obtain the line image distribution functions in the x-axis direction, the alignment detection system 400 need only sense a slit pattern having its slit width in the x-axis direction on a reference plate arranged on the wafer stage 350 so as to have a surface flush with that of the wafer 340. Likewise, to obtain the line image distribution functions in the y-axis direction, the alignment detection system 400 need only sense a slit pattern having its slit width in the y-axis direction on a reference plate arranged on the wafer stage 350 so as to have a surface flush with that of the wafer 340. The optical images of the alignment mark in the x-axis direction are processed using the line image distribution functions in the x-axis direction, and those of the alignment mark in the y-axis direction are processed using the line image distribution functions in the y-axis direction.

The thus obtained line image distribution functions and the optical images of the alignment mark AM are stored in the first storage unit 16 and the second storage unit 17, respectively. The calculation unit 18 executes an arithmetic process shown in equations (4) to (8) (or (9)) using the line image distribution functions and the optical images of the alignment mark AM stored in the first storage unit 16 and the second storage unit 17, respectively. With this operation, optical images of the alignment mark AM for light beams having a plurality of wavelengths are restored to generate an optical image (see equation (8)) of the alignment mark AM, for which the asymmetry is reduced. This process is performed for an alignment mark formed in each shot on the wafer 340.

The optical image of the alignment mark AM generated by the calculation unit 18 is sent to the control unit 360. The control unit 360 executes a process of detecting the position of the alignment mark AM. In this embodiment, the control unit 360 detects the position of the alignment mark AM using a template matching method. However, the calculation unit 18 also can execute a process of detecting the position of the alignment mark AM. Also, the control unit 360 may have the function of the calculation unit 18.

The template matching method performs correlation operation between a signal S corresponding to the optical image of the alignment mark shown in FIG. 11B, and a model signal (template) T which is shown in FIG. 11A and is provided to the apparatus in advance, and detects a position having a highest correlation as the center of the alignment mark. A resolution as high as 1/10 to 1/50 pixel can be attained by calculating the barycentric pixel position in a region of several pixels to both the left and right from the peak in a function E describing the correlation value shown in FIG. 11C. Note that FIGS. 11A to 11C are charts for explaining a template matching method.

The template matching method is described by:

$$E(x) = \frac{1}{\sum_{J=-k}^{k} [S(x+J) - T(J)]^2} \quad (10)$$

where S is the signal corresponding to the optical image of the alignment mark AM generated by the calculation unit 18, T is the model signal, and E is the correlation value. The relationship among the signal S, model signal T, and correlation value E is as shown in FIGS. 11A to 11C. FIGS. 11A to 11C show a processing method for one of the four marks $AM_1$ to $AM_4$ of the alignment mark AM. Likewise, the positions of the other three marks on the line sensor 426 are detected using the template matching method.

Central positions $X1(n)$, $X2(n)$, $X3(n)$, and $X4(n)$ of the four marks $AM_1$ to $AM_4$ of the alignment mark AM are thus calculated using the template matching method (unit: pixel). Note that n is the template number. Averaging the central positions $X1(n)$ to $X4(n)$ of the four marks $AM_1$ to $AM_4$ yields the overall central position Xa(n) of the alignment mark AM:

$$Xa(n)=\{X1(n)+X2(n)+X3(n)+X4(n)\}/4 \qquad (11)$$

A misalignment Xw(n) of the alignment mark AM on the wafer 340 is given by:

$$Xw(n)=Xa(n)/(Px \cdot M) \qquad (12)$$

where M is the imaging magnification of the alignment detection system 400, and Px is the pixel pitch of the line sensor 426 in the position detection direction.

A method of aligning the wafer 340 based on the detection result (misalignment) of the alignment mark will be explained next. This embodiment adopts global alignment (AGA: Advanced Global Alignment). The global alignment is performed by selecting several shots of all shots (chips) on the wafer 340 and detecting the positions of the alignment marks in the selected shots. Note that the selected shot will be referred to as a "sample shot" hereinafter.

FIG. 12 is a view showing a misalignment of the shot array on the wafer 340 with respect to the x-y coordinate system on the wafer stage 350 of the exposure apparatus 300. As shown in FIG. 12, a misalignment of the wafer 340 can be represented by six parameters: a shift Sx in the x-axis direction, a shift Sy in the y-axis direction, a tilt θx with respect to the x-axis, a tilt θy with respect to the y-axis, a magnification Bx in the x-axis direction, and a magnification By in the y-axis direction. The magnifications Bx and By in the x- and y-axis directions, respectively, represent the expansion/contraction of the wafer 340 with reference to the feed of the wafer stage in the exposure apparatus 300, which occurs upon heating the wafer 340 in, for example, film formation or etching in the semiconductor process.

A detection value Ai in each sample shot of the AGA, and a design coordinate position Di of the alignment mark AM in the sample shot are defined by:

$$Ai = \begin{pmatrix} xi \\ yi \end{pmatrix} \qquad (13)$$

$$Di = \begin{pmatrix} Xi \\ Yi \end{pmatrix} \qquad (14)$$

where i is the detection shot number.

In the AGA, using the six parameters Sx, Sy, θx, θy, Bx, and By representing a misalignment of the wafer 340, a linear coordinate transform D'i:

$$D'i = \begin{pmatrix} Bx & -\theta y \\ \theta x & By \end{pmatrix} Di + \begin{pmatrix} Sx \\ Sy \end{pmatrix} \qquad (15)$$

is calculated.

Note that, in equation (15), approximations such as cos θ=1, sin θ=0, θx×Bx=θx, and θy×By≈θy are used because θx and θy are small values (≈0) and Bx and By satisfy Bx=By 1.

FIG. 13 is a diagram schematically showing, using vectors, the linear coordinate transform D'i shown in equation (15). In FIG. 13, the alignment mark on the wafer 340 lies at a position indicated by W, and the alignment mark is misaligned from a design position M by Ai. In this case, calculating the linear coordinate transform D'i yields a misalignment (residual) Ri of the alignment mark on the wafer 340:

$$Ri=(Di+Ai)-D'i \qquad (16)$$

The AGA adopts the least squares method so that the residual Ri in each sample shot is minimum. More specifically, the six parameters Sx, Sy, θx, θy, Bx, and By which minimize the mean square sum of the residual Ri are calculated by:

$$V = \frac{1}{n}\sum |Ri|^2 \qquad (17)$$

$$= \frac{1}{n}\sum_{i=1}^{i=n}\left|\begin{pmatrix}xi\\yi\end{pmatrix} - \begin{pmatrix}Bx-1 & -\theta y\\ \theta x & By\end{pmatrix}\begin{pmatrix}Xi\\Yi\end{pmatrix} + \begin{pmatrix}S\\x\end{pmatrix}\right|^2$$

$$\begin{pmatrix} \delta V/\delta Sx \\ \delta V/\delta Sy \\ \delta V/\delta \theta x \\ \delta V/\delta \theta y \\ \delta V/\delta Bx \\ \delta V/\delta By \end{pmatrix} = 0 \qquad (18)$$

The six parameters Sx, Sy, θx, θy, Bx, and By are calculated by substituting the detection values (xi, yi) in each sample shot and the design position (Xi, Yi) of the alignment mark into equations (17) and (18). Each shot on the wafer 340 is aligned based on the six parameters, and then exposure is performed.

In this embodiment, an optical image of the alignment mark is generated by restoring and compositing optical images of the alignment mark for light beams having a plurality of wavelengths (see equation (8)). However, an optical image ff(x) of the alignment mark may be generated by weighting the restored optical images of the alignment mark in proportion to their contrasts C(λ) by:

$$ff(x) = \frac{\sum_{\lambda 1}^{\lambda n}[c(\lambda)^2 \cdot f(x,\lambda)]}{\sum_{\lambda 1}^{\lambda n} c(\lambda)^2} \qquad (19)$$

This makes it possible to enhance (signals corresponding to) optical images having high contrasts, thus improving the S/N ratio.

Although the weighting is performed using the square of the contrast in this embodiment, the weighting method is not particularly limited to this, and another method may be adopted.

In this manner, since the alignment detection system 400 according to this embodiment can reduce the asymmetry of the optical image of the alignment mark, it can accurately detect the position of the alignment mark. Hence, the exposure apparatus 300 can provide high-quality devices (e.g., a semiconductor integrated circuit device and a liquid crystal display device) with a high throughput and a good economical efficiency. The devices are fabricated by a step of exposing a substrate (e.g., a wafer or a glass plate) coated with a resist (photosensitive agent) using the exposure apparatus 300, a step of developing the exposed substrate, and other known steps.

Also, in this embodiment, the wavelength selection unit 12 time-serially selects the wavelength of light which illuminates the alignment mark in the illumination system 400A. However, the illumination system 400A may illuminate the alignment mark with light beams having a plurality of wavelengths, and the imaging system 400B may separate light beams having different wavelengths from the light reflected by the alignment mark. In this case, the imaging system 400B includes a light separation unit which separates light beams having a plurality of wavelengths from the light reflected by the alignment mark (the target object or the target pattern).

Figure 14:
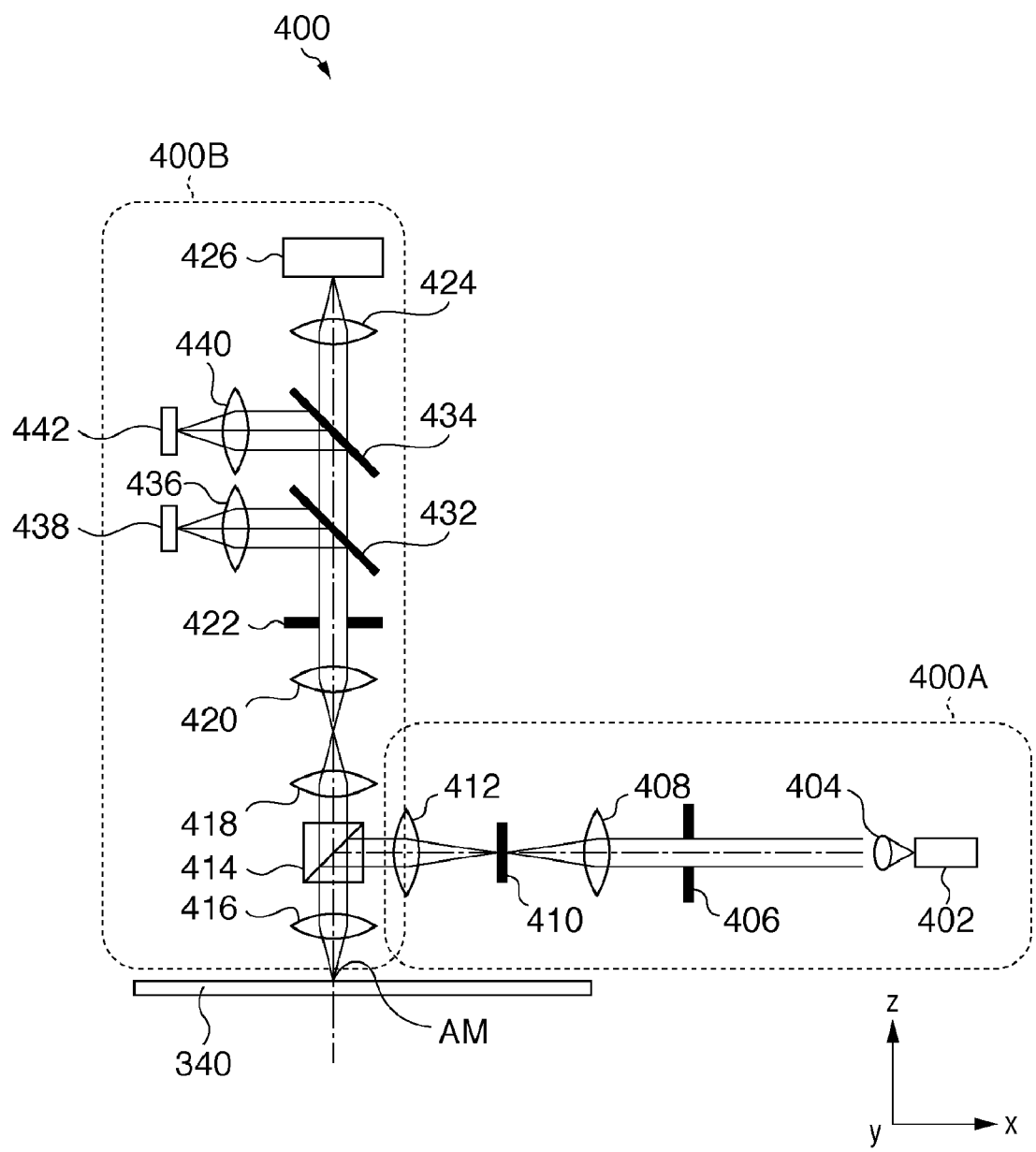
FIG. 14 is a schematic view showing another arrangement of the alignment detection system in the exposure apparatus shown in FIG. 1.

FIG. 14 is a schematic view showing another arrangement of the alignment detection system 400. Referring to FIG. 14, light from a light source 402 is expanded into collimated light by a lens 404, and enters an aperture stop 406. The light having passed through the aperture stop 406 is converged by a lens 408, and enters an aperture 410.

The light having passed through the aperture 410 is expanded into collimated light by a lens 412, and reflected by a beam splitter 414. The light reflected by the beam splitter 414 illuminates the alignment mark AM on the wafer 340 via a lens 416. The light reflected by the alignment mark AM enters an aperture stop 422 via the lens 416, the beam splitter 414, and lenses 418 and 420.

Dichroic mirrors 432 and 434 are inserted in the optical path of the imaging system 400B in the succeeding stage of the aperture stop 422. The light reflected by the dichroic mirror 432 is converged by a lens 436, and sensed (received) by a line sensor 438. Likewise, the light reflected by the dichroic mirror 434 is converged by a lens 440, and sensed (received) by a line sensor 442.

Figure 15:
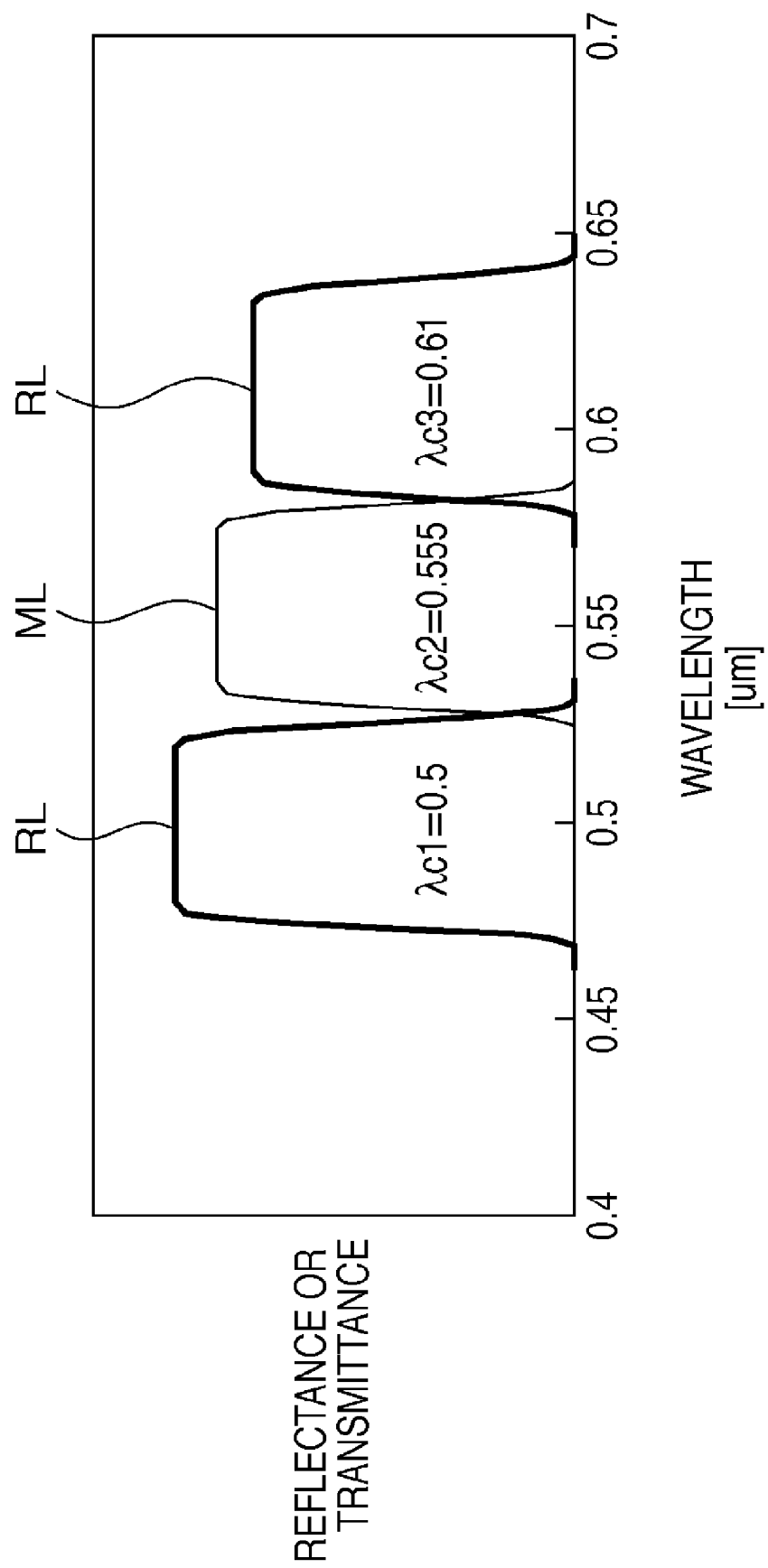
FIG. 15 is a graph showing the reflectance characteristics of dichroic mirrors of the alignment detection system shown in FIG. 14.

The dichroic mirror 432 has a reflectance characteristic indicated by RL in FIG. 15. The dichroic mirror 432 effectively reflects light having a center wavelength $\lambda c1=0.5$ μm and a wavelength width of 50 nm, and effectively transmits light having longer wavelengths. Hence, the line sensor 438 senses an optical image of the alignment mark AM formed by light having a center wavelength $\lambda c1=0.5$ μm and a wavelength width of 50 nm.

The dichroic mirror 434 has a reflectance characteristic indicated by RL' in FIG. 15. The dichroic mirror 434 effectively reflects light having a center wavelength $\lambda c3=0.61$ μm and a wavelength width of 50 nm, and effectively transmits light having longer wavelengths. Hence, the line sensor 442 senses an optical image of the alignment mark AM formed by light having a center wavelength $\lambda c3=0.61$ μm and a wavelength width of 50 nm.

The light which is transmitted through the dichroic mirrors 432 and 434 and enters a line sensor 426 via a lens 424 has a center wavelength $\lambda c2=0.555$ μm and a wavelength width of 50 nm, as indicated by ML in FIG. 15.

As mentioned above, the alignment detection system 400 shown in FIG. 14 can receive light beams having wavelengths of 0.555 μm, 0.5 μm, and 0.61 μm by the three line sensors 426, 438, and 442, respectively. This makes it possible to simultaneously obtain the optical images of the alignment mark and the line image distribution functions (point image distribution functions) for light beams having a plurality of wavelengths (in this embodiment, light beams having wavelengths of 0.555 μm, 0.5 μm, and 0.61 μm).

The alignment detection system 400 shown in FIG. 14 has an imaging system 400B more complicated than that of the alignment detection system 400 shown in FIG. 8. However, since the alignment detection system 400 shown in FIG. 14 can simultaneously obtain the optical images of the alignment mark AM and the line image distribution functions (point image distribution functions) for light beams having a plurality of wavelengths, it is excellent in throughput. In addition, since the alignment detection system 400 shown in FIG. 14 limits the wavelength width of light separated using the dichroic mirror, it is possible to insert a chromatic aberration correction unit corresponding to only the limited wavelength width into the optical path after the separation, thus facilitating chromatic aberration correction. Although three dichroic mirrors are used in this embodiment, increasing the number of dichroic mirrors makes it possible to separate light beams having a larger number of wavelengths from the light reflected by the alignment mark AM at a smaller wavelength pitch.

Figure 16:
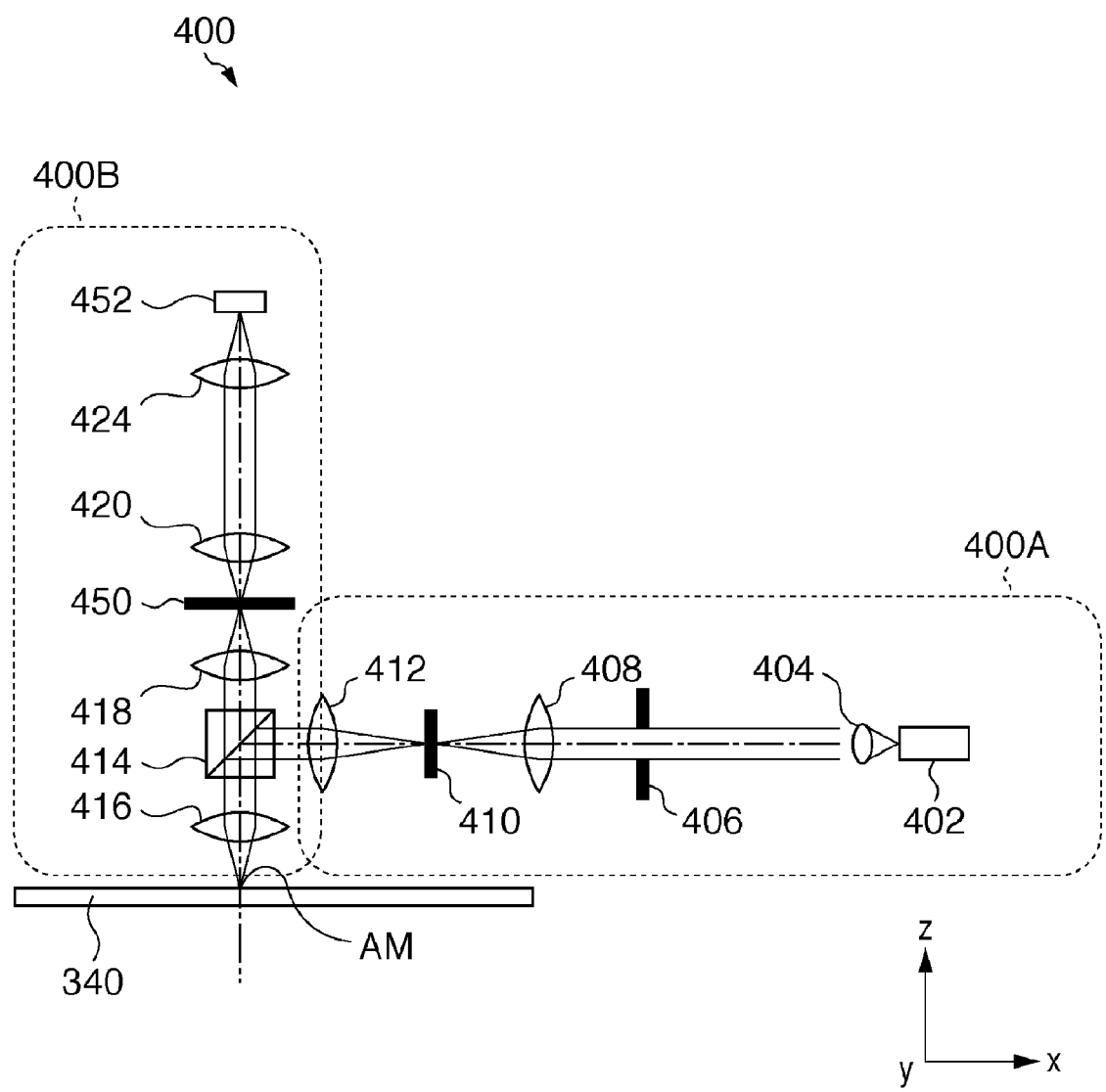
FIG. 16 is a schematic view showing still another arrangement of the alignment detection system in the exposure apparatus shown in FIG. 1.

FIG. 16 is a schematic view showing still another arrangement of the alignment detection system 400. The alignment detection system 400 shown in FIG. 16 splits the light reflected by the alignment mark AM in a direction perpendicular to the position detection direction using a two-dimensional area sensor and bandpass filter.

Referring to FIG. 16, light from a light source 402 is expanded into collimated light by a lens 404, and enters an aperture stop 406. The light having passed through the aperture stop 406 is converged by a lens 408, and enters an aperture 410. The light having passed through the aperture 410 is expanded into collimated light by a lens 412, and reflected by a beam splitter 414.

The light reflected by the beam splitter 414 illuminates the alignment mark AM on the wafer 340 via a lens 416. The light reflected by the alignment mark AM enters a bandpass filter 450, which is inserted in the optical path of an imaging system 400B in the succeeding stage of a lens 418, via the lens 416, beam splitter 414, and lens 418.

Figure 17:
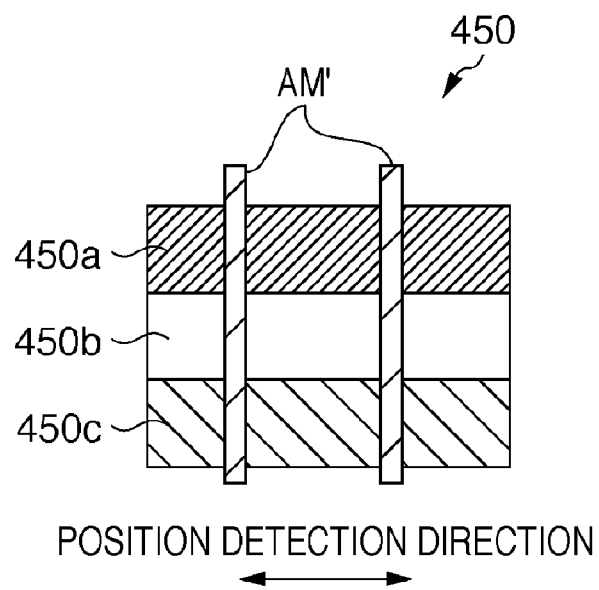
FIG. 17 is a schematic view showing the structure of a bandpass filter of the alignment detection system shown in FIG. 16.

FIG. 17 is a schematic view showing the structure of the bandpass filter 450. The bandpass filter 450 is configured by forming three types of band-like multilayer films 450a, 450b, and 450c on a transparent substrate along a direction perpendicular to the position detection direction of the alignment mark AM, as shown in FIG. 17. In this embodiment, the transmission wavelength widths of the multilayer films 450a, 450b, and 450c are from 480 nm to 520 nm, from 520 nm to 560 nm, and from 560 nm to 600 nm, respectively. The bandpass filter 450 is arranged at a position optically conjugate to that of the alignment mark AM, so an optical image AM' of the alignment mark AM is formed on the bandpass filter 450.

Figure 18:
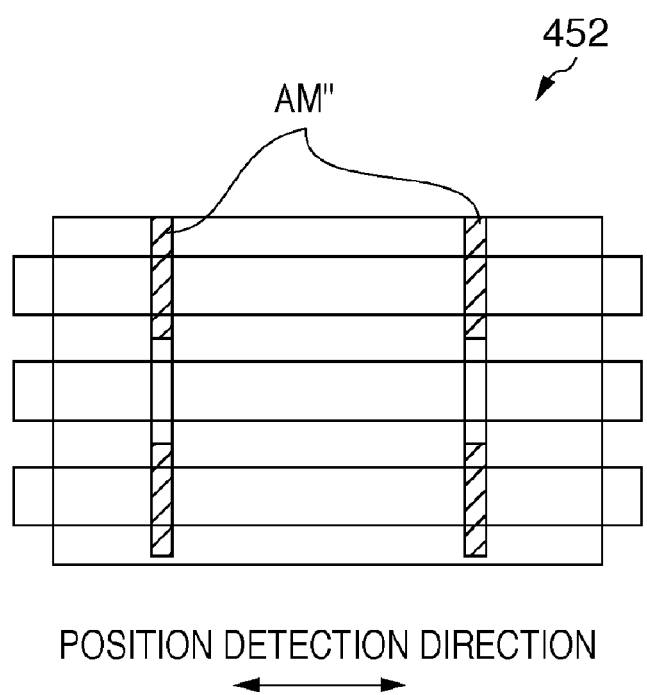
FIG. 18 is a view showing an optical image of an alignment mark formed on an area sensor of the alignment detection system shown in FIG. 16.

An area sensor 452 is also arranged at a position optically conjugate to those of the alignment mark AM and bandpass filter 450, so an optical image AM" of the alignment mark AM is formed on the area sensor 452, as shown in FIG. 18. Hence, the area sensor 452 can obtain the optical image AM" of the alignment mark AM when the alignment mark AM is illuminated with light beams having different wavelengths in a direction perpendicular to the position detection direction of the alignment mark AM. As a consequence, selecting readout lines of the area sensor 452 makes it possible to obtain the optical images of the alignment mark AM for light beams having a plurality of wavelengths. FIG. 18 is a view showing an optical image AM" of the alignment mark AM formed on the area sensor 452.

Although the bandpass filter includes three multilayer films in this embodiment, increasing the number of multilayer films of the bandpass filter makes it possible to separate light beams having a larger number of wavelengths from the light reflected by the alignment mark AM at a smaller wavelength pitch.

The bandpass filter 450 may be arranged in the illumination system 400A, and, for example, can be arranged at the position of the aperture 410, which is optically conjugate to that of the alignment mark AM. In this case, the bandpass filter 450 may be arranged in the transmitting portion (i.e., the opening portion) of the aperture 410, and also serve as a field stop.

Figure 19:
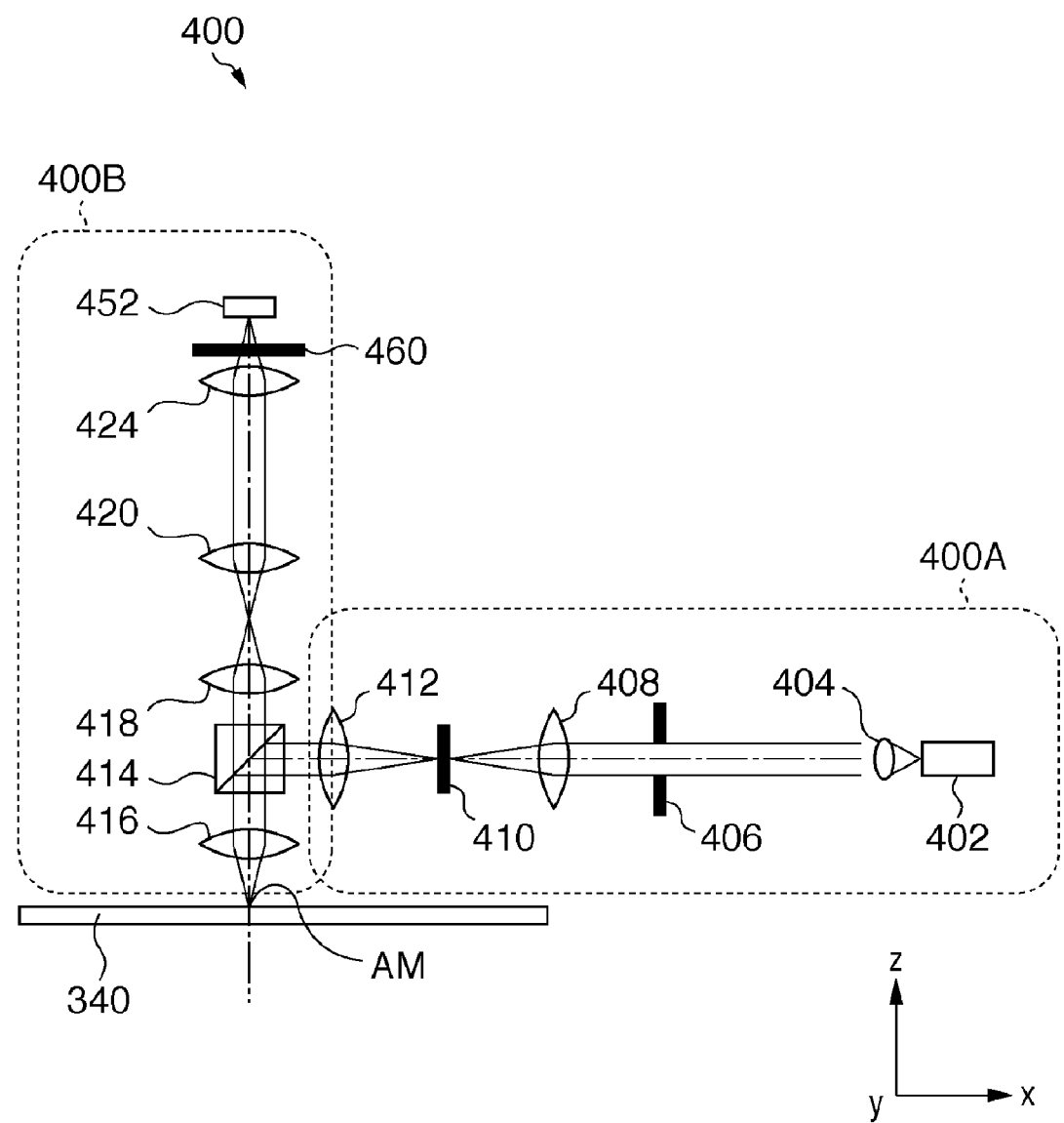
FIG. 19 is a schematic view showing still another arrangement of the alignment detection system in the exposure apparatus shown in FIG. 1.

FIG. 19 is a schematic view showing still another arrangement of the alignment detection system 400. The alignment detection system 400 shown in FIG. 19 splits the light reflected by the alignment mark AM in a direction perpendicular to the position detection direction using a two-dimensional area sensor and diffraction grating.

Referring to FIG. 19, light from a light source 402 is expanded into collimated light by a lens 404, and enters an aperture stop 406. The light having passed through the aperture stop 406 is converged by a lens 408, and enters an aperture 410. The light having passed through the aperture 410 is expanded into collimated light by a lens 412, and reflected by a beam splitter 414.

The light reflected by the beam splitter 414 illuminates the alignment mark AM on the wafer 340 via a lens 416. The light reflected by the alignment mark AM enters a diffraction grating 460, which is inserted into the optical path of an imaging system 400B in the succeeding stage of a lens 424, via the lens 416, the beam splitter 414, the lens 418, a lens 420, and the lens 424.

Figure 20:
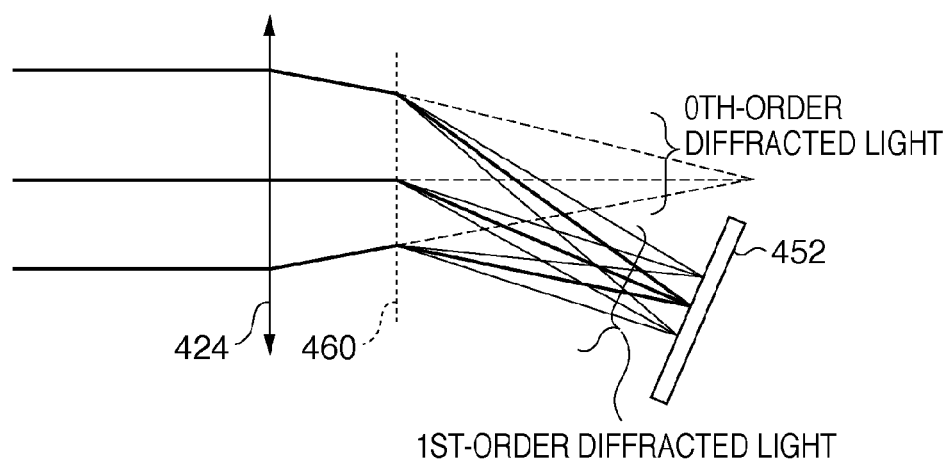
FIG. 20 is a view showing the diffraction (splitting) action of a diffraction grating of the alignment detection system shown in FIG. 19.
Figure 21:
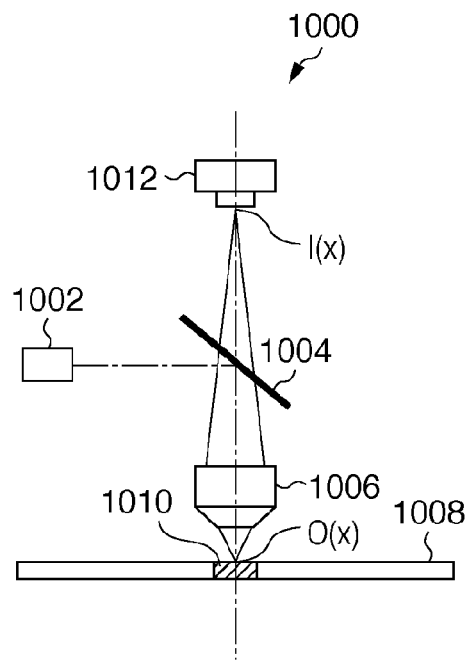
FIG. 21 is a schematic view showing a conventional position detection apparatus.
Figure 22:
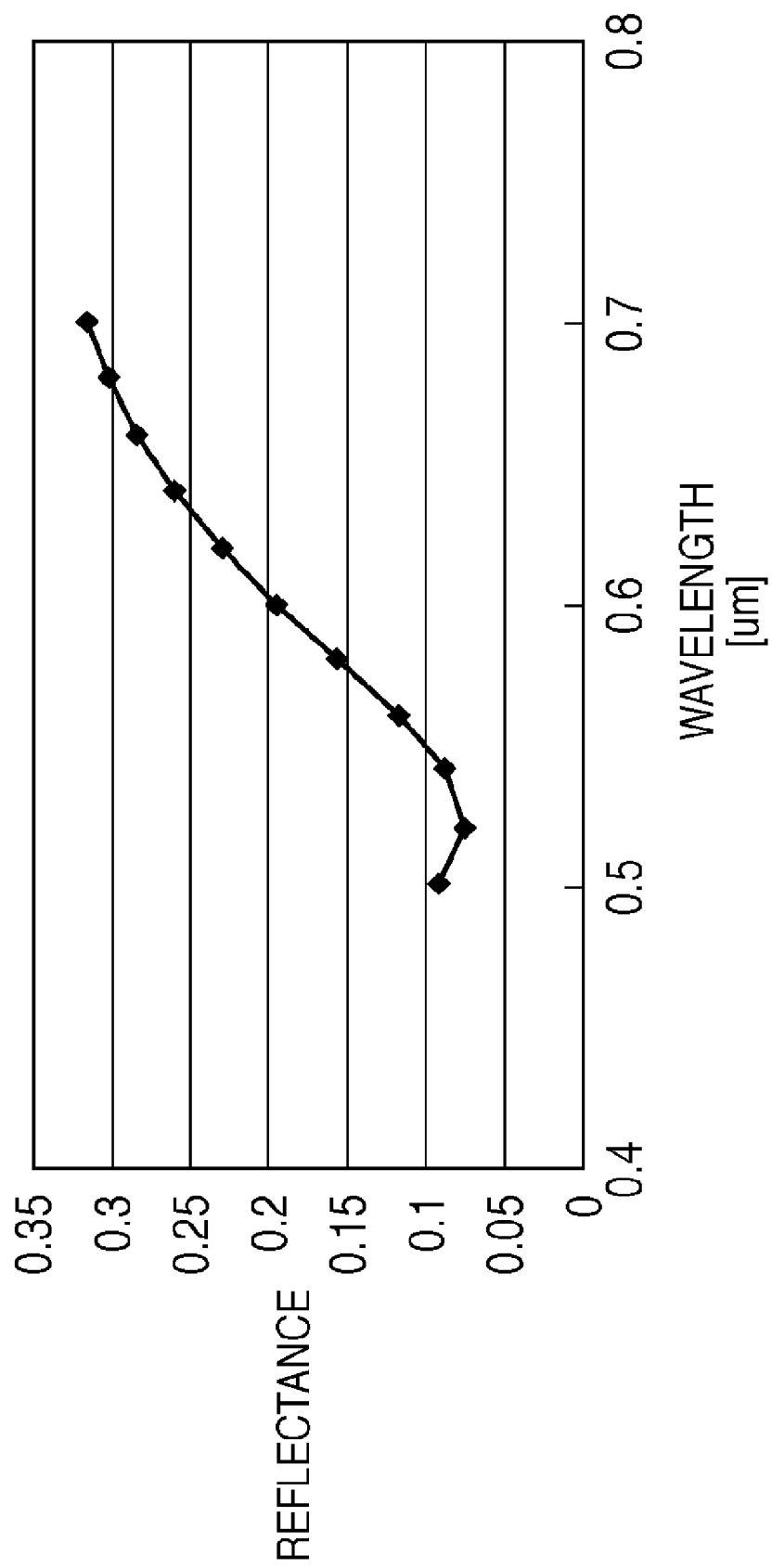
FIG. 22 is a graph showing an example of the wavelength dependence of the reflectance of a wafer (alignment mark) serving as the target object.

In this embodiment, the diffraction grating 460 is inserted between the lens 424 and the area sensor 452. The diffraction grating 460 has a grating extending in a direction perpendicular to the position detection direction of the alignment mark AM. The diffraction grating 460 is configured such that the area sensor 452 receives diffracted light (the 0th- and 1st-order diffracted light beams) diffracted by the diffraction grating 460, as shown in FIG. 20. With this configuration, optical images of the alignment mark AM are formed on the area sensor 452 by light beams having different continuous wavelengths in a direction perpendicular to the position detection direction of the alignment mark AM by the diffraction (splitting) action of the diffraction grating 460. With this operation, arbitrarily selecting and averaging readout lines of the area sensor 452 in a direction perpendicular to the position detection direction of the alignment mark AM makes it possible to obtain the optical image of the alignment mark AM for light having an arbitrary wavelength and wavelength width. The alignment detection system 400 shown in FIG. 19 can freely select light beams having different wavelengths and wavelength widths by appropriately selecting the number of readout lines of the area sensor 452. FIG. 20 is a view showing the diffraction (splitting) action of the diffraction grating 460 of the alignment detection system 400 shown in FIG. 19.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-084098, filed on Mar. 27, 2008, which is hereby incorporated by reference herein in its entirety.

What is claimed is:

1. A position detection apparatus which detects a position of a target object, the apparatus comprising:
a light source configured to emit light having a wavelength width onto the target object;
an imaging optical system configured to form an image of the light from the target object on an image sensor;
a first obtaining unit configured to obtain imaging characteristics of said imaging optical system for a plurality of light beams, having different wavelength with each other, of the light having the wavelength width;
a second obtaining unit configured to obtain optical images of the target object for the plurality of the light beams;
a restoration unit configured to restore optical images of the target object for the plurality of the light beams by correcting, deterioration in the optical images of the target object obtained by said second obtaining unit attributed to said imaging optical system, based on the imaging characteristics of said imaging optical system obtained by said first obtaining unit;
a generation unit configured to generate an optical image of the target object for light including the plurality of the light beams by synthesizing the optical images of the target object for the plurality of the light beams, which are restored by said restoration unit; and
a determination unit configured to determine the position of the target object based on the optical image of the target object for the light including the plurality of the light beams, which is generated by said generation unit.

2. The apparatus according to claim 1, wherein the imaging characteristics of said imaging optical system are one of point image distribution functions of said imaging optical system, line image distribution functions of said imaging optical system, and transfer functions of said imaging optical system.

3. The apparatus according to claim 2, wherein said restoration unit deconvolutes the optical images of the target object for the plurality of the light beams, which are obtained by said second obtaining unit, and one of the point image distribution functions of said imaging optical system and the line image distribution functions of said imaging optical system.

4. The apparatus according to claim 2, wherein letting $g(\lambda)$ be the optical images of the target object for the plurality of the light beams, which are obtained by said second obtaining unit, $G(\omega, \lambda)$ be Fourier transforms of the optical images $g(\lambda)$ of the target object, and $H(\lambda)$ be the transfer functions of said imaging optical system, the optical images $f(\lambda)$ of the target object for the plurality of the light beams, which are restored by said restoration unit, are given by:

$$f(\lambda) = \frac{1}{2\pi}\int_{-\infty}^{+\infty} G(\omega, \lambda) \times H(\omega, \lambda)^{-1} \cdot \exp(-i\omega x)\, d\omega.$$

5. The apparatus according to claim 1, further comprising a wavelength selection unit configured to select, as light which illuminates the target object, the plurality of the light beams from the light having the wavelength width,
wherein said wavelength selection unit includes
a plurality of bandpass filters configured to pass light having different wavelength, and
a turret configured to exchangeably insert said plurality of bandpass filters into an optical path between said light source and the target object.

6. The apparatus according to claim 1, further comprising a light separation unit configured to separate the light from the target object into the plurality of light beams,
wherein said light separation unit includes dichroic mirrors configured to reflect the plurality of the light beams to a plurality of image sensors.

7. The apparatus according to claim 1, further comprising
a light separation unit configured to separate the light from the target object into the plurality of light beams,
wherein said light separation unit includes a diffraction grating configured to diffract each of the light beams into each corresponding region on the image sensor.

8. A position detection method using a position detection apparatus including a light source which emits light having a wavelength width onto a target object, and an imaging optical system which forms an image of the light from the target object on an image sensor, the method comprising:
a first obtaining step of obtaining imaging characteristics of the imaging optical system for a plurality of light beams, having different wavelength with each other, of the light having the wavelength width;
a second obtaining step of obtaining optical images of the target object for the plurality of light beams;
a restoration step of restoring optical images of the target object for the plurality of the light beams by correcting, deterioration in the optical images of the target object obtained in the second obtaining step attributed to the imaging optical system, based on the imaging characteristics of the imaging optical system obtained in the first obtaining step;
a generation step of generating an optical image of the target object for light including the plurality of the light beams by synthesizing the optical images of the target object for the plurality of light beams, which are restored in the restoration step; and
a determination step of determining the position of the target object based on the optical image of the target object for the light including the plurality of the light beams, which is generated in the generation step.

9. An exposure apparatus comprising:
a projection optical system configured to project a pattern of a reticle onto a substrate;
a position detection apparatus according to claim 8.

10. A device fabrication method comprising steps of:
exposing a substrate using an exposure apparatus; and
performing a development process for the substrate exposed,
wherein said exposure apparatus includes:
a projection optical system configured to project a pattern of a reticle onto the substrate;
a position detection apparatus which includes a light source configured to emit light having a wavelength width onto the substrate, and an imaging optical system configured to form, on an image sensor, an image of the light from an alignment mark formed on the substrate, and which is configured to detect a position of the substrate; and
an adjusting unit configured to adjust the position of the substrate based on the position of the substrate detected by said position detection apparatus,
wherein said position detection apparatus includes
a first obtaining unit configured to obtain imaging characteristics of said imaging optical system for a plurality of light beams, having different wavelength with each other, of the light having the wavelength width,
a second obtaining unit configured to obtain optical images of the alignment mark for the plurality of the light beams,
a restoration unit configured to restore optical images of the alignment mark for the plurality of the light beams by correcting, deterioration in the optical images of the alignment mark obtained by said second obtaining unit attributed to said imaging optical system, based on the imaging characteristics of said imaging optical system obtained by said first obtaining unit,
a generation unit configured to generate an optical image of the alignment mark for light including the plurality of light beams by synthesizing the optical images of the alignment mark for the plurality of light beams, which are restored by said restoration unit, and
a determination unit configured to determine the position of the substrate based on the optical image of the alignment mark for the light including the plurality of light beams, which is generated by said generation unit.

* * * * *